US012706730B2

(12) United States Patent
Lin

(10) Patent No.: US 12,706,730 B2
(45) Date of Patent: Aug. 11, 2026

(54) COMMUNICATION CIRCUITS INCLUDING A DIFFERENTIAL TO QUADRATURE PHASE GENERATOR

(71) Applicant: Taiwan Semiconductor Manufacturing Company, Ltd., Hsinchu (TW)

(72) Inventor: Wei Shuo Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 117 days.

(21) Appl. No.: 18/757,154

(22) Filed: Jun. 27, 2024

(65) Prior Publication Data

US 2026/0005828 A1 Jan. 1, 2026

(51) Int. Cl.

| | |
|---|---|
| ***H04L 5/12*** | (2006.01) |
| ***H03K 5/00*** | (2006.01) |
| ***H03L 7/081*** | (2006.01) |
| ***H04L 7/00*** | (2006.01) |
| ***H04L 7/033*** | (2006.01) |
| ***H04L 23/02*** | (2006.01) |

(52) U.S. Cl.

CPC ............. *H04L 7/0025* (2013.01); *H03K 5/00* (2013.01); *H03L 7/0814* (2013.01); *H04L 7/0337* (2013.01); *H03K 2005/00052* (2013.01)

(58) Field of Classification Search

CPC ... H04L 7/0025; H04L 7/0337; H03L 7/0814; H03K 2005/00052; H03K 5/00; H04B 1/0028

USPC ................................ 375/298, 261, 371, 373

See application file for complete search history.

(56) References Cited

U.S. PATENT DOCUMENTS

2014/0184281 A1 7/2014 Danny et al.
2019/0178685 A1 6/2019 Amiri et al.
2024/0162921 A1 * 5/2024 Chakraborty ........ H04B 1/0028

* cited by examiner

*Primary Examiner* — Phuong Phu
(74) *Attorney, Agent, or Firm* — Merchant & Gould P.C.

(57) ABSTRACT

A device includes a transmission clock circuit that includes a phase interpolator circuit and a transmission differential to quadrature phase generator. The phase interpolator circuit interpolates phases and provides phase interpolated first clock signals and phase interpolated second clock signals. The transmission differential to quadrature phase generator, duty cycle corrects each of the phase interpolated first clock signals and the phase interpolated second clock signals, quadrature error corrects each of the duty cycle corrected phase interpolated first clock signals and the duty cycle corrected phase interpolated second clock signals, outputs transmission clock signals based on the quadrature error corrected duty cycle corrected phase interpolated first clock signals, and outputs multiple clock phases and a track signal based on the quadrature error corrected duty cycle corrected phase interpolated second clock signals.

20 Claims, 13 Drawing Sheets

| Area um^2 | ADCC+DQEC | ADCC+AQEC |
|---|---|---|
| N3 | 817 | 420 |

COMMUNICATION CIRCUITS INCLUDING A DIFFERENTIAL TO QUADRATURE PHASE GENERATOR

BACKGROUND

Communication circuits are systems that facilitate the transmission of data between two or more devices. A universal chiplet interconnect express (UCIE) communication circuit serves as a standardized protocol and physical interface that allows chiplets to communicate and exchange data efficiently. The chiplets are individual functional blocks or components that can be independently designed and fabricated, offering flexibility and modularity in system design. The UCIE communication circuit supports high-speed data transfer and low latency communication between the chiplets. Also, the UCIE communication circuit simplifies the design and manufacturing process by providing a standardized communication interface, reducing the time and effort required for system integration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

DETAILED DESCRIPTION

Figure 1:
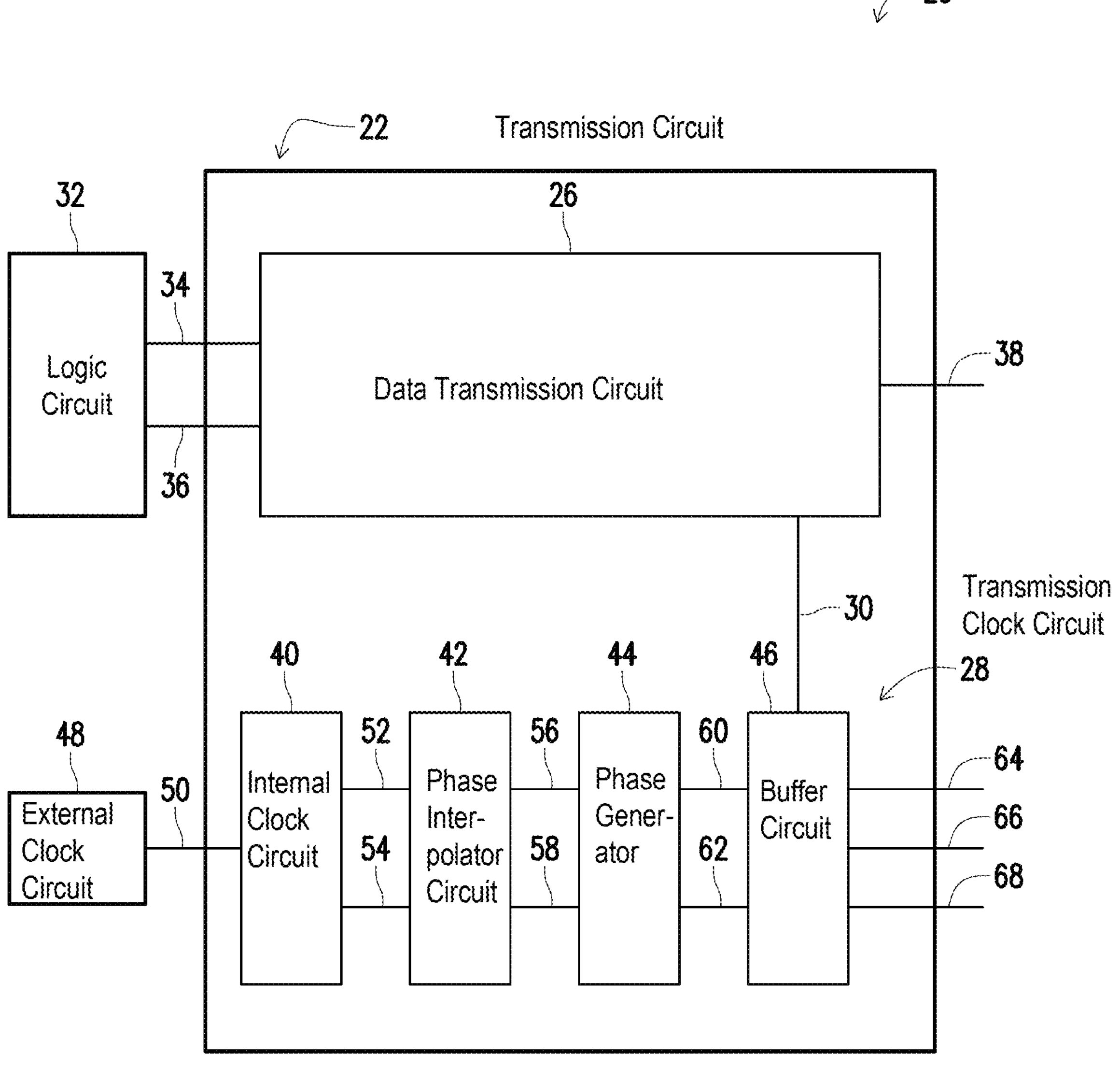
FIG. 1 is a diagram schematically illustrating a transmission circuit of a UCIE communication circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some communication circuits include duty cycle error detectors and phase error detectors. A duty cycle error detector is a circuit that measures and detects deviations in the duty cycle of a periodic signal. The duty cycle represents the ratio of a signal's active (on) time to its total period. The duty cycle error detector compares the actual duty cycle of a signal to the duty cycle of another signal, such as a complementary signal, or to a reference and calculates the difference between them. The duty cycle error detector provides an output signal that indicates the magnitude and direction of the error, allowing for adjustments to be made to the duty cycle of the signal. For example, the average DC value of a signal is proportional to its duty-cycle, such that resistor-capacitor (RC) filters can be used to extract duty cycle values from signals and the duty cycle values can be compared to each other or to a reference by an operation amplifier to determine errors in the duty cycles.

A phase error detector is a device that measures and detects deviations between phases of periodic signals, where the phase of a signal refers to the relative position or timing of its waveform with respect to another signal. The phase error detector compares the phase of a signal with the phase of another signal or a reference signal and calculates the phase difference between them. The phase error detector provides an output signal that indicates the magnitude and direction of a phase error, allowing for adjustments to be made to maintain phase alignment.

Disclosed embodiments provide a communication circuit that includes at least one differential to quadrature phase generator that receives at least one clock phase, generates differential signals of the at least one clock phase, such as complementary signals with opposite polarities, and converts the differential signals into quadrature phase signals that include four clock phase signals that are 90 degrees out of phase with each other. The differential to quadrature phase generator ensures that the quadrature phase signals are accurately generated and synchronized with incoming signals.

Disclosed embodiments provide a device that includes a transmission circuit and a receiver circuit. The transmission circuit includes a data transmission circuit configured to receive data and transmit the data and a transmission clock circuit configured to generate transmission clock signals that are used by the data transmission circuit to transmit the data. The receiver circuit includes a data receiver circuit configured to receive the transmitted data and generate output data and a receiver clock circuit configured to generate receiver clock signals based on clock signals from the transmission circuit and used by the data receiver circuit to receive the transmitted data and generate the output data.

In some embodiments, the transmission clock circuit includes a phase interpolator and a transmission differential to quadrature phase generator. The transmission clock circuit receives a clock signal and generates a first clock signal and a second clock signal. The phase interpolator receives the first clock signal and the second clock signal and interpolates phases for each of the first clock signal and the second clock signal. The transmission differential to quadrature phase generator receives phase interpolated first clock signals and phase interpolated second clock signals, duty cycle corrects the phase interpolated first clock signals and the phase interpolated second clock signals, generates differential signals of the phase interpolated first clock signals and the phase interpolated second clock signals, and quadrature error corrects each of the duty cycle corrected phase interpolated first clock signals and the duty cycle corrected phase interpolated second clock signals to generate the transmission clock signals, multiple clock phases, and a track signal. The receiver clock circuit includes a receiver differential to quadrature phase generator. The receiver clock circuit receives the multiple clock phases and the track signal and generates clock phases and track signals. The receiver differential to quadrature phase generator duty cycle corrects and quadrature error corrects each of the clock phases to generate the receiver clock signals.

Disclosed embodiments further provide a method of operating a communications circuit that includes at least one differential to quadrature phase generator. The method includes receiving at least one clock signal at a transmission clock circuit; generating, by the transmission clock circuit, a first clock signal and a second clock signal; receiving the first clock signal and the second clock signal at a phase interpolator circuit; phase interpolating, by the phase interpolator circuit, each of the first clock signal and the second clock signal; receiving the phase interpolated first clock signal and the phase interpolated second clock signal at a transmission differential to quadrature phase generator; duty cycle correcting, by the transmission differential to quadrature phase generator, each of the phase interpolated first clock signal and the phase interpolated second clock signal; quadrature error correcting, by the transmission differential to quadrature phase generator, each of the duty cycle corrected phase interpolated first clock signal and the duty cycle corrected phase interpolated second clock signal to generate transmission clock signals, multiple clock phases, and a track signal. The method further includes receiving data at a data transmission circuit and transmitting the data from the data transmission circuit based on the transmission clock signals.

Also, the method includes receiving, by a receiver clock circuit, the multiple clock phases and the track signal from the transmission clock circuit; providing clock phase signals based on the multiple clock phases; generating, by a track circuit, track signals from the track signal; receiving the clock phase signals and the track signals at a receiver differential to quadrature phase generator; duty cycle correcting, by the receiver differential to quadrature phase generator, the clock phase signals; quadrature error correcting, by the receiver differential to quadrature phase generator, the duty cycle corrected clock phase signals to generate receiver clock signals. The method further includes receiving the receiver clock signals at a data receiver circuit and receiving the transmitted data and outputting output data based on the receiver clock signals.

Advantages of the disclosed communication circuits include low distortion, providing a 50% duty-cycle, offset cancelation, and process, voltage, and temperature (PVT) immunity.

Figure 2:
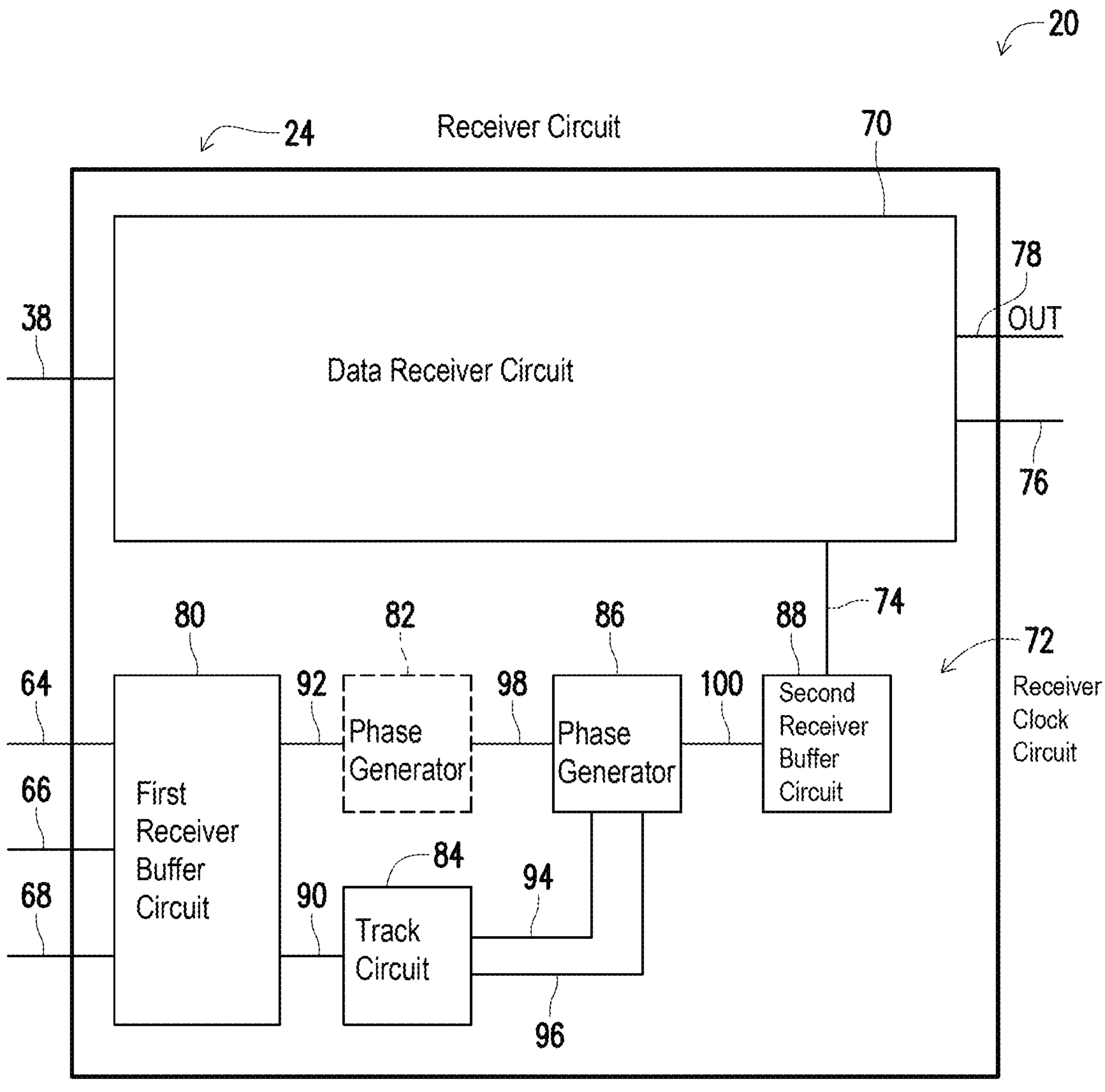
FIG. 2 is a diagram schematically illustrating a receiver circuit of the UCIE communication circuit, in accordance with some embodiments.

FIGS. 1 and 2 are diagrams schematically illustrating a UCIE communication circuit 20, in accordance with some embodiments. The UCIE communication circuit 20 includes a transmission circuit 22 shown in FIG. 1 and a receiver circuit 24 shown in FIG. 2. Each of the transmission circuit 22 and the receiver circuit 24 includes at least one differential to quadrature phase generator that receives multiple (2) clock phases, generates differential signals that include complementary signals with opposite polarities, and aligns the differential signals into quadrature phase signals of four clock phase signals 90 degrees out of phase with each other. The differential to quadrature phase generator ensures that the quadrature signals are accurately generated and synchronized with incoming signals. In some embodiments, the UCIE communication circuit 20 is a semiconductor device, an integrated circuit device, and/or an electronic device. In some embodiments, the UCIE communication circuit 20 is an electronic device that includes chiplets.

FIG. 1 is a diagram schematically illustrating the transmission circuit 22 of the UCIE communication circuit 20, in accordance with some embodiments. The transmission circuit 22 includes a data transmission circuit 26 and a transmission clock circuit 28. The data transmission circuit 26 is electrically connected to the transmission clock circuit 28 by transmission clock signal path 30.

The data transmission circuit 26 is electrically connected to a logic circuit 32 by data path 34 and clock signal path 36. The data transmission circuit 26 receives data from the logic circuit 32 by the data path 34 and a clock signal for clocking in the data by the clock signal path 36. The data transmission circuit 26 receives transmission clock signals by transmission clock signal path 30. The transmission clock signals are used by the data transmission circuit 26 to transmit the data at data output 38.

The transmission clock circuit 28 includes an internal clock circuit 40, a phase interpolator circuit 42, a transmission differential to quadrature phase generator 44, and a buffer circuit 46. The internal clock circuit 40 is electrically connected to an external clock circuit 48 by external clock circuit path 50 and to the phase interpolator circuit 42 by first clock path 52 and second clock path 54. The internal clock circuit 40 receives at least one clock signal from the external clock circuit 48 by the external clock signal path 50 and provides a first clock signal and a second clock signal to the phase interpolator circuit 42 by the first clock signal path 52 and the second clock signal path 54, respectively.

The phase interpolator circuit 42 is electrically connected to the transmission differential to quadrature phase generator 44 by first phase interpolated clock signal path 56 and second phase interpolated clock signal path 58. The phase interpolator circuit 42 interpolates phases for each of the first clock signal and the second clock signal and provides phase interpolated first clock signals and phase interpolated second clock signals that are received by the transmission differential to quadrature phase generator 44 by the first phase interpolated clock signal path 56 and the second phase interpolated clock signal path 58, respectively.

The transmission differential to quadrature phase generator 44 is electrically connected to the buffer circuit 46 by a first transmission signal path 60 and a second transmission signal path 62. The transmission differential to quadrature phase generator 44 is configured to duty cycle correct each of the phase interpolated first clock signals and the phase interpolated second clock signals. The transmission differential to quadrature phase generator 44 is further configured to quadrature error correct each of the duty cycle corrected phase interpolated first clock signals and the duty cycle corrected phase interpolated second clock signals to provide quadrature error corrected duty cycle corrected phase interpolated first clock signals and quadrature error corrected duty cycle corrected phase interpolated second clock signals on the first transmission signal path 60 and the second transmission signal path 62.

The buffer circuit 46 provides the transmission clock signals to the data transmission circuit 26 by transmission clock signal path 30. Also, the buffer circuit 46 provides multiple (2) clock phases on phase clock paths 64 and 66 and the track signal on track signal path 68. In some embodiments, the buffer circuit 46 includes at least one first buffer for providing the transmission clock signals to the data transmission circuit 26 and at least one second buffer for providing the multiple (2) clock phases and the track signal to the receiver circuit 24.

In some embodiments, the transmission differential to quadrature phase generator 44 includes at least one transmission duty cycle corrector to correct the duty cycle of the phase interpolated first clock signals and at least one transmission duty cycle corrector to correct the duty cycle of the phase interpolated second clock signals. In some embodiments, the transmission differential to quadrature phase generator 44 includes at least one transmission quadrature error corrector to quadrature error correct the duty cycle corrected phase interpolated first clock signals to provide the transmission clock signals, and at least one transmission quadrature error corrector to quadrature error correct the duty cycle corrected phase interpolated second clock signals to provide the multiple (2) clock phases and the track signal. In some embodiments, each of the transmission duty cycle correctors include an analog duty cycle corrector. In some embodiments, each of the transmission quadrature error correctors include an analog quadrature error corrector. In some embodiments, each of the transmission quadrature error correctors include a digital quadrature error corrector.

FIG. 2 is a diagram schematically illustrating the receiver circuit 24 of the UCIE communication circuit 20, in accordance with some embodiments. The receiver circuit 24 includes a data receiver circuit 70 and a receiver clock circuit 72. The data receiver circuit 70 is electrically connected to the receiver clock circuit 72 by receiver clock signal path 74.

The data receiver circuit 70 is electrically connected to the data transmission circuit 26, shown in FIG. 1, by the data output 38. The data receiver circuit 70 receives data from the data transmission circuit 26 by the data output 38. The data receiver circuit 70 receives receiver clock signals from the receiver clock circuit 72 by the receiver clock signal path 74. The receiver clock signals are used by the data receiver circuit 70 for clocking the data from the data transmission circuit 26 into the data receiver circuit 70. The data receiver circuit 70 receives an external clock signal by external clock signal path 76 and transmits the data out of the data receiver circuit 70 at the output OUT 78.

The receiver clock circuit 72 includes a first receiver buffer circuit 80, an optional phase generator 82, a track circuit 84, a receiver differential to quadrature phase generator 86, and a second receiver buffer circuit 88. The first receiver buffer circuit 80 is electrically connected to the buffer circuit 46 by phase clock paths 64 and 66 and track signal path 68, and to the track circuit 84 by first receiver buffer path 90. Optionally, the first receiver buffer circuit 80 is electrically connected to the phase generator 82 by a second receiver buffer path 92 or the first receiver buffer circuit 80 is electrically connected directly to the receiver differential to quadrature phase generator 86 by the second receiver buffer path 92. The first receiver buffer circuit 80 receives the multiple (2) clock phases on phase clock paths 64 and 66 and the track signal on the track signal path 68.

The track circuit 84 is electrically connected to the receiver differential to quadrature phase generator 86 by track signal paths 94 and 96. The track circuit 84 receives the track signal and generates multiple track signals that are provided to the receiver differential to quadrature phase generator 86 by track signal paths 94 and 96. In some embodiments, the phase generator 82 is electrically connected to the receiver differential to quadrature phase generator 86 by clock phase path 98. The phase generator 82 receives the multiple (2) clock phases and generates clock phases that are provided to the receiver differential to quadrature phase generator 86.

The receiver differential to quadrature phase generator 86 is electrically connected to the second receiver buffer circuit 88 by a receiver signal path 100. The receiver differential to quadrature phase generator 86 is configured to duty cycle correct and quadrature error correct the clock phase signals and provide quadrature error corrected duty cycle corrected clock phase signals as receiver clock signals to the second buffer circuit 88 on the receiver signal path 100.

The second buffer circuit 88 provides the receiver clock signals to the data receiver circuit 70 by the receiver clock signal path 74 for receiving the transmitted data and outputting the output data.

In some embodiments, the receiver differential to quadrature phase generator 86 includes at least one receiver duty cycle corrector to correct the duty cycles of the clock phase signals. In some embodiments, the receiver differential to quadrature phase generator 86 includes at least one receiver quadrature error corrector to correct phases of the duty cycle corrected clock phase signals. In some embodiments, each of the receiver duty cycle correctors includes a digital duty cycle corrector. In some embodiments, each of the receiver quadrature error correctors includes an analog quadrature error corrector. In some embodiments, each of the receiver quadrature error correctors includes a digital quadrature error corrector.

Figure 3:
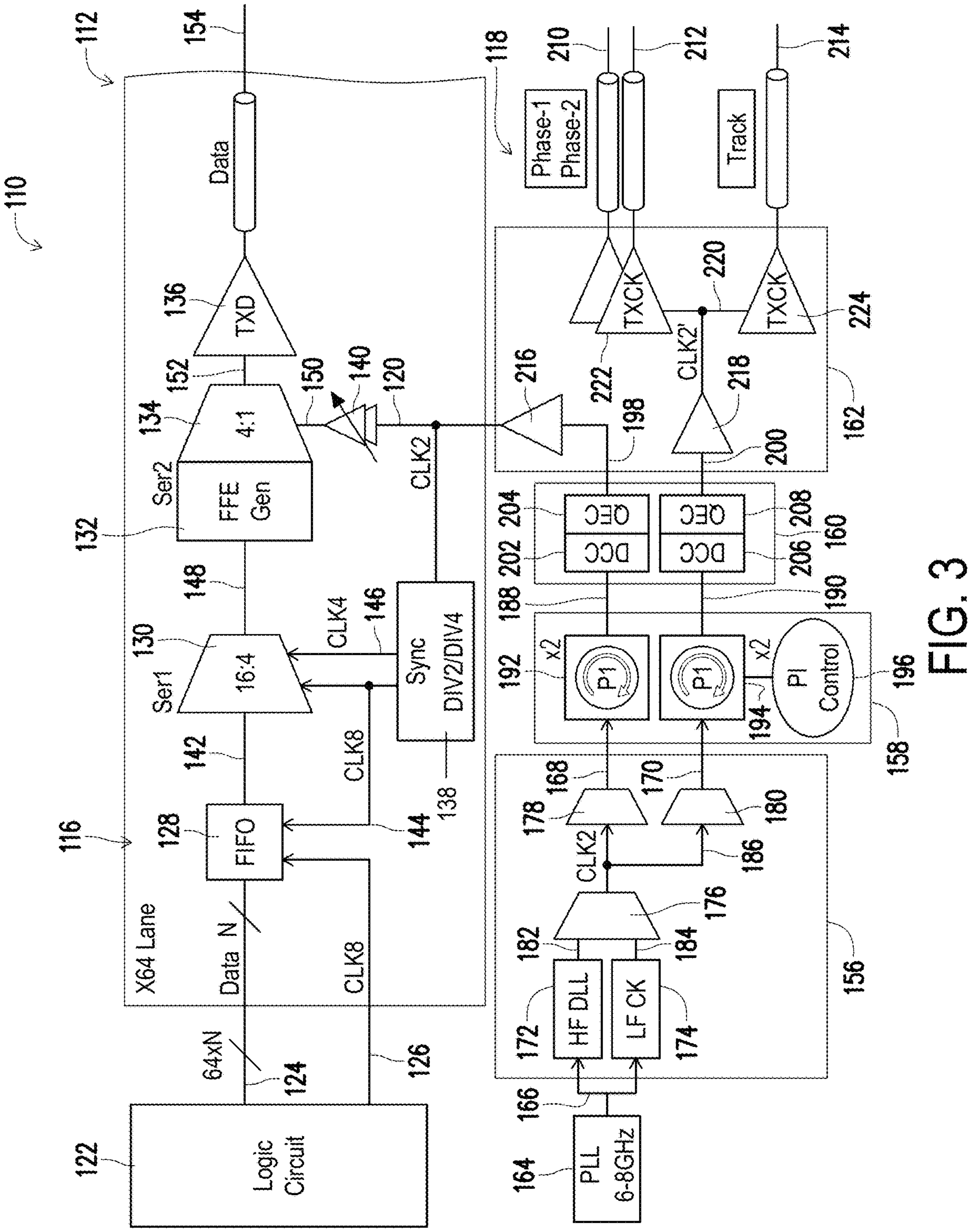
FIG. 3 is a diagram schematically illustrating a transmission circuit of another UCIE communication circuit, in accordance with some embodiments.
Figure 4:
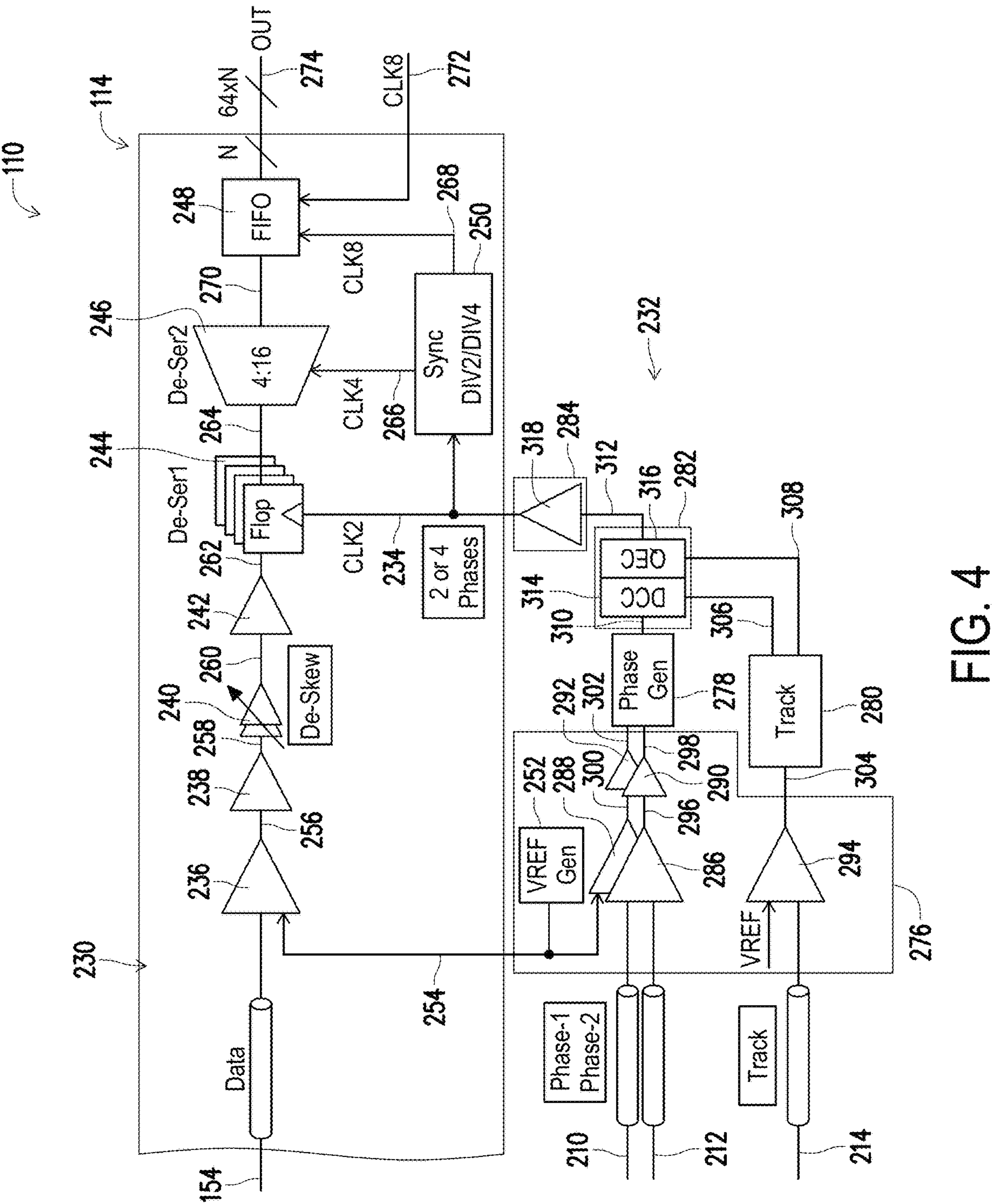
FIG. 4 is a diagram schematically illustrating a receiver circuit of the other UCIE communication circuit, in accordance with some embodiments.

FIGS. 3 and 4 are diagrams schematically illustrating a UCIE communication circuit 110, in accordance with some embodiments. The UCIE communication circuit 110 includes a transmission circuit 112 shown in FIG. 3 and a receiver circuit 114 shown in FIG. 4. Each of the transmission circuit 112 and the receiver circuit 114 includes at least one differential to quadrature phase generator that receives multiple (2) clock phases, generates differential signals that include complementary signals with opposite polarities, and aligns the differential signals into quadrature phase signals of four clock phase signals 90 degrees out of phase with each other. The differential to quadrature phase generator ensures that the quadrature signals are accurately generated and synchronized with other signals. In some embodiments, the UCIE communication circuit 110 is a semiconductor device, an integrated circuit device, and/or an electronic device. In some embodiments, the UCIE communication circuit 110 is an electronic device that includes chiplets.

FIG. 3 is a diagram schematically illustrating the transmission circuit 112 of the UCIE communication circuit 110, in accordance with some embodiments. The transmission circuit 112 includes a data transmission circuit 116 and a transmission clock circuit 118. The data transmission circuit 116 is electrically connected to the transmission clock circuit 118 by transmission clock signal path 120.

The data transmission circuit 116 is electrically connected to a logic circuit 122 by data path 124 and clock signal path 126. The data transmission circuit 116 includes a first-in first-out (FIFO) 128, a first serializer 130, a feed forward equalizer (FFE) generator 132, a second serializer 134, and a transmit data buffer 136. Also, the data transmission circuit 116 includes a divide by 2 and a divide by 4 synchronization circuit 138 and deskew buffers 140.

The synchronization circuit 138 and the deskew buffers 140 receive a clock signal CLK2 from the transmission clock circuit 118 by transmission clock signal path 120. In some embodiments, the clock signal CLK2 includes four phases, such as at 0, 90, 180, and 270 degrees.

The FIFO 128 receives data, such as 64 bits of data in parallel, from the logic circuit 122 by the data path 124 and a first clock signal CLK8 from the logic circuit 122 by the clock signal path 126 for clocking the data into the FIFO 128. The first clock signal CLK8 on the clock signal path 126 is an external clock signal that is at a clock rate equal to a divide by 4 clock rate of the clock signal CLK2.

The FIFO 128 is electrically connected to the first serializer 130 by data path 142. The synchronization circuit 138 is electrically connected to the FIFO 128 and the first serializer 130 by divide by 4 clock path 144 and to the first serializer 130 by divide by 2 clock path 146. The synchronization circuit 138 provides a divide by 4 clock signal CLK8 to the FIFO 128 and the first serializer 130 and a divide by 2 clock signal CLK4 to the first serializer 130 for clocking data out of the FIFO 128 and for controlling data flow through the first serializer 130. In some embodiments, the first serializer 130 is a 16:4 serializer 130.

The FFE generator 132 is electrically connected to the first serializer 130 by first serializer output path 148 and to the second serializer 134. The FFE generator 132 receives data from the first serializer 130 and expands data eyes of the data before passing the data to the second serializer 134. The second serializer 134 is electrically connected to the deskew buffers 140 by deskew buffer path 150 and to the transmit data buffer 136 by transmit data buffer path 152. The second serializer 134 receives deskewed clock signals from the deskew buffers 140 and data from the FFE generator 132 and provides serial data to the transmit data buffer 136 that outputs the serial data on data output 154.

The transmission clock circuit 118 includes an internal clock circuit 156, a phase interpolator circuit 158, a transmission differential to quadrature phase generator 160, and a buffer circuit 162. The internal clock circuit 156 is electrically connected to an external clock circuit 164 by external clock circuit path 166 and to the phase interpolator circuit 158 by first clock signal path 168 and second clock signal path 170. In some embodiments, the external clock circuit 164 includes a phase locked loop (PLL). In some embodiments, the external clock circuit 164 includes a PLL that provides a clock signal at 6-8 giga-hertz (GHz).

The internal clock circuit 156 includes a high frequency delay locked loop (HF DLL) 172, a low frequency clock (LF CK) 174, a first multiplexer 176, and second and third multiplexers or selection circuits 178 and 180, respectively. Each of the HF DLL 172 and the LF CK 174 receives the external clock signal from the external clock circuit 164 by external clock circuit path 166.

The HF DLL 172 is electrically connected to the first multiplexer 176 by first input path 182 and the LF CK 174 is electrically connected to the first multiplexer 176 by second input path 184. The first multiplexer 176 is electrically connected to each of the second and third multiplexers 178 and 180 by multiplexer output path 186. The output of second multiplexer 178 is electrically connected to the phase interpolator circuit 158 by the first clock signal path 168, and the output of the third multiplexer 180 is electrically connected to the phase interpolator circuit 158 by the second clock signal path 170.

The HF DLL 172 and the LF CK 174 receive a clock signal from the external clock circuit 164 by the external clock circuit path 166. The HF DLL 172 provides a high frequency first clock signal to the first input of the first multiplexer 176 and the LF CK 174 provides a low frequency second clock signal to the second input of the first multiplexer 176. The first multiplexer 176 outputs one of the received input signals to the second and third multiplexers 178 and 180 by multiplexer output path 186. The second and third multiplexers 178 and 180 output clock signals to the phase interpolator circuit 158 by the first clock signal path 168 and the second clock signal path 170, respectively.

The phase interpolator circuit 158 is electrically connected to the transmission differential to quadrature phase generator 160 by first and second phase interpolated clock signal paths 188 and 190. The phase interpolator circuit 158 includes a first phase interpolator 192, a second phase interpolator 194, and a phase interpolator control circuit 196. The first phase interpolator 192 receives the first clock signals from the second multiplexer 178 by the first clock signal path 168, and the second phase interpolator 194 receives the second clock signals from the third multiplexer 180 by the second clock signal path 170. The first phase interpolator 192 interpolates phases for the first clock signal, such as from one clock phase to multiple (2) clock phases of 0 and 90 degrees, and provides phase interpolated first clock signals. The second phase interpolator 194 interpolates phases for the second clock signal, such as from one clock phase to multiple (2) clock phases of 45 and 135 degrees, and provides phase interpolated second clock signals. The phase interpolator control circuit 196 controls operation of the first phase interpolator 192 and the second phase interpolator 194.

The transmission differential to quadrature phase generator 160 is electrically connected to the buffer circuit 162 by a first transmission signal path 198 and a second transmission signal path 200. The transmission differential to quadrature phase generator 160 includes a first duty cycle corrector (DCC) 202, a first quadrature error corrector (QEC) 204, a second DCC 206, and a second QEC 208. In some embodiments, one or more of the transmission first and second DCCs 202 and 206 includes an analog duty cycle corrector. In some embodiments, one or more of the transmission first and second QECs 204 and 208 includes an analog quadrature error corrector. In some embodiments, one or more of the transmission first and second QECs 204 and 208 includes a digital quadrature error corrector.

The first DCC 202 is electrically connected to the first phase interpolator 192 by the first phase interpolated clock signal path 188 and to the first QEC 204 that is electrically connected to the buffer circuit 162 by the first transmission signal path 198. The second DCC 206 is electrically connected to the second phase interpolator 194 by the second phase interpolated clock signal path 190 and to the second QEC 208 that is electrically connected to the buffer circuit 162 by the second transmission signal path 200.

The first DCC 202 receives the phase interpolated first clock signals, such as the multiple (2) clock phases of 0 and 90 degrees, duty cycle corrects the phase interpolated first clock signals, and generates differential clock signals of the duty cycle corrected phase interpolated first clock signals. The first QEC 204 receives the duty cycle corrected phase interpolated first clock signals, quadrature error corrects the duty cycle corrected phase interpolated first clock signals and provides quadrature error corrected duty cycle corrected phase interpolated first clock signals on the first transmission signal path 198. In some embodiments, the first QEC 204 provides quadrature error corrected duty cycle corrected phase interpolated first clock signals of four phases, such as 0, 90, 180, and 270 degrees.

The second DCC 206 receives the phase interpolated second clock signals, such as the multiple (2) clock phases of 45 and 135 degrees, duty cycle corrects the phase interpolated second clock signals, and generates differential clock signals of the duty cycle corrected phase interpolated second clock signals. The second QEC 208 receives the duty cycle corrected phase interpolated second clock signals, quadrature error corrects the duty cycle corrected phase interpolated second clock signals and provides quadrature error corrected duty cycle corrected phase interpolated second clock signals on the second transmission signal path 200. In some embodiments, the second QEC 208 provides quadrature error corrected duty cycle corrected phase interpolated second clock signals of four phases, such as 45, 135, 225, and 315 degrees.

The buffer circuit 162 provides the transmission clock signals to the data transmission circuit 116 by the transmission clock signal path 120. The transmission clock signals are the clock signals CLK2 from the transmission clock circuit 118 on transmission clock signal path 120. Also, the buffer circuit 162 provides multiple (2) clock phases on phase clock paths 210 and 212 and the track signal on track signal path 214. In some embodiments, the clock signals CLK2 include four phases, such as at 0, 90, 180, and 270 degrees. In some embodiments, the multiple (2) clock phases are 45 and 135 degrees. In some embodiments, the track signal is a clock phase of 45 degrees.

The buffer circuit 162 includes a first clock buffer 216 that receives the quadrature error corrected duty cycle corrected phase interpolated first clock signals on the first transmission signal path 198 and provides the clock signal CLK2 from the transmission clock circuit 118 on transmission clock signal path 120. Also, the buffer circuit 162 includes a second clock buffer 218 that receives the quadrature error corrected duty cycle corrected phase interpolated second clock signals on the second transmission signal path 200 and provides a second clock signal CLK2' on clock signal path 220. The second clock buffer 218 is electrically connected to transmission buffers 222 and a track transmission buffer 224 by the clock signal path 220. The transmission buffers 222 transmit the multiple (2) clock phases on phase clock paths 210 and 212 and the track transmission buffer 224 transmits the track signal on track signal path 214 to the receiver circuit 114.

FIG. 4 is a diagram schematically illustrating the receiver circuit 114 of the UCIE communication circuit 110, in accordance with some embodiments. The receiver circuit 114 includes a data receiver circuit 230 and a receiver clock circuit 232. The data receiver circuit 230 is electrically connected to the receiver clock circuit 232 by receiver clock signal path 234. Also, the data receiver circuit 230 is electrically connected to the data transmission circuit 116, shown in FIG. 3, by the data output 154. The data receiver circuit 230 receives data from the data transmission circuit 116 by the data output 154.

The data receiver circuit 230 includes a data receiver amplifier 236, a first receiver buffer 238, a deskew buffer 240, a second receiver buffer 242, first de-serializer flip-flops 244, a second de-serializer 246, an output FIFO 248, and a divide by 2 and divide by 4 synchronization circuit 250.

The data receiver amplifier 236 is electrically connected to the data transmission circuit 116 by the data output 154 and to a voltage reference circuit 252 by reference voltage path 254. Also, the data receiver amplifier 236 is electrically connected to the first receiver buffer 238 by first amplifier output path 256. The data receiver amplifier 236 receives data from the data transmission circuit 116 by the data output 154 and provides the received data to the first receiver buffer 238.

The first receiver buffer 238 is electrically connected to the deskew buffer 240 by first buffer output path 258 and the deskew buffer 240 is electrically connected to the second receiver buffer 242 by deskew buffer output path 260. The first receiver buffer 238 receives the data from the data receiver amplifier 236 and provides the data to the deskew buffer 240 that deskews the data and provides the deskewed data to the second receiver buffer 242.

The second receiver buffer 242 is electrically connected to the first de-serializer flip-flops 244 by second buffer output path 262. The first de-serializer flip-flops 244 are electrically connected to the second de-serializer 246 by first de-serializer output path 264 and to the receiver clock circuit 232 by receiver clock signal path 234. The first de-serializer flip-flops 244 receive a receiver clock signal CLK2 on the receiver clock signal path 234 for clocking in data from the second receiver buffer 242. The first de-serializer flip-flops 244 provide parallel data to the second de-serializer 246 by first de-serializer output path 264. In some embodiments, the receiver clock signal CLK2 includes multiple (2) clock phases, such as at 45 and 135 degrees. In some embodiments, the receiver clock signal CLK2 includes four clock phases, such as at 45, 135, 225, and 315 degrees.

The synchronization circuit 250 receives the receiver clock signal CLK2 from the receiver clock circuit 232 by receiver clock signal path 234. The synchronization circuit 250 is electrically connected to the second de-serializer 246 by first clock output 266 and to the output FIFO 248 by second clock output 268. The synchronization circuit 250 generates and provides a divide by 2 receiver clock signal CLK4 on the first output path 266 and a divide by 4 receiver clock signal CLK8 on the second output path 268.

The second de-serializer 246 is electrically connected to the output FIFO 248 by second de-serializer output path 270. The second de-serializer 246 receives the parallel data from the first de-serializer flip-flops 244 and the receiver clock signal CLK4 on the first output path 266 and provides larger parallel data units to the output FIFO 248. In some embodiments, the second de-serializer 246 is a 4:16 bit de-serializer.

The FIFO 248 receives the receiver clock signal CLK8 on the second output path 268 and clocks in the larger parallel data units from the second de-serializer 246. The FIFO 248 receives an external clock signal CLK8 on external clock signal path 272 and transmits the data out of the FIFO 248 at output OUT 274. In some embodiments, the FIFO 248 outputs 64 bits of data in parallel.

The receiver clock circuit 232 includes a first receiver buffer circuit 276, an optional phase generator 278, a track circuit 280, a receiver differential to quadrature phase generator 282, and a second receiver buffer circuit 284. The first receiver buffer circuit 276 is electrically connected to the buffer circuit 162, shown in FIG. 3, by the phase clock paths 210 and 212 and the track signal path 214.

The first receiver buffer circuit 276 includes clock signal amplifiers 286 and 288, clock signal buffers 290 and 292, and track signal amplifier 294. Each of the clock signal amplifiers 286 and 288 is electrically connected to the voltage reference circuit 252 by reference voltage path 254 to receive a reference voltage. Also, the track signal amplifier 294 is electrically connected to the voltage reference circuit 252 by reference voltage path 254 to receive a reference voltage.

The clock signal amplifier 286 is electrically connected to the clock signal buffer 290 by amplifier output path 296. The clock signal buffer 290 is electrically connected to the phase generator 278 by buffer output path 298 or, optionally, the clock signal buffer 290 is electrically connected to the receiver differential to quadrature phase generator 282 by the buffer output path 298.

The clock signal amplifier 288 is electrically connected to the clock signal buffer 292 by amplifier output path 300. The clock signal buffer 292 is electrically connected to the phase generator 278 by buffer output path 302 or, optionally, the clock signal buffer 292 is electrically connected to the receiver differential to quadrature phase generator 282 by the buffer output path 302.

The first clock signal amplifier 286 receives the clock signal on the phase clock path 210 and provides the clock signal to the first clock signal buffer 290 that provides the clock signal to the phase generator 278 or directly to the differential to quadrature phase generator 282. The second clock signal amplifier 288 receives the clock signal on the phase clock path 212 and provides the clock signal to the second clock signal buffer 292 that provides the clock signal to the phase generator 278 or directly to the differential to quadrature phase generator 282. The track signal amplifier 294 receives the clock signal on the track signal path 214 and provides the clock signal to the track circuit 280 on track signal path 304.

The track circuit 280 is electrically connected to the receiver differential to quadrature phase generator 282 by track signal paths 306 and 308. The track circuit 280 receives the track signal and generates multiple track signals that are provided to the receiver differential to quadrature phase generator 282 by the track signal paths 306 and 308. The track circuit 280 tracks PVT variations to adjust clock signals and maintain proper operation of the UCIE communication circuit 110. In some embodiments, the phase generator 278 is included and electrically connected to the receiver differential to quadrature phase generator 282 by clock phase path 310. The phase generator 278 receives the multiple (2) clock phases and generates one or more clock phases that are provided to the receiver differential to quadrature phase generator 282.

The receiver differential to quadrature phase generator 282 is electrically connected to the second receiver buffer circuit 284 by a receiver signal path 312. The receiver differential to quadrature phase generator 282 includes a receiver DCC 314 and a receiver QEC 316. In some embodiments, the receiver DCC 314 includes a digital duty cycle corrector. In some embodiments, the receiver QEC 316 includes an analog quadrature error corrector. In some embodiments, the receiver QEC 316 includes a digital quadrature error corrector.

The receiver differential to quadrature phase generator 282 is configured to duty cycle correct and quadrature error correct the clock phase signals, which are based on the multiple (2) clock phases received from the transmission clock circuit 118 and provide quadrature error corrected duty cycle corrected clock phase signals as receiver clock signals to the second receiver buffer circuit 284 by the receiver signal path 312.

The receiver DCC 314 is electrically connected to the phase generator 278 by clock phase path 310 or the receiver DCC 314 is directly connected to the clock signal buffers 290 and 292. Also, the receiver DCC 314 is electrically connected to the receiver QEC 316 that is electrically connected to the second receiver buffer circuit 284 by the receiver signal path 312.

The receiver DCC 314 receives the clock phase signals, such as the multiple (2) clock phases of 45 and 135 degrees, duty cycle corrects the clock phase signals, and generates differential clock signals of the duty cycle corrected clock phase signals. The receiver QEC 316 receives the duty cycle corrected clock phase signals, quadrature error corrects the duty cycle corrected clock phase signals and provides quadrature error corrected duty cycle corrected clock phase signals on the receiver signal path 312. In some embodiments, the receiver QEC 316 provides quadrature error corrected duty cycle corrected clock phase signals of four phases, such as 45, 135, 225, and 315 degrees.

The second receiver buffer circuit 284 includes a receiver clock buffer 318 that receives the quadrature error corrected duty cycle corrected clock phase signals and provides them to the data receiver circuit 114 by the receiver clock signal path 234 for receiving the transmitted data and de-serializing the data.

The UCIE communication circuit 110 includes the transmission circuit 112, shown in FIG. 3, and the receiver circuit 114, shown in FIG. 4. Each of the transmission circuit 112 and the receiver circuit 114 includes at least one differential to quadrature phase generator that receives multiple (2) clock phases, generates differential signals that include complementary signals with opposite polarities, and quadrature error corrects the differential signals to provide quadrature phase signals of four clock phase signals 90 degrees out of phase with each other.

In some embodiments, the transmission circuit 112 includes analog controlled duty cycle correctors (ADCCs) with digitally controlled quadrature error correctors (DQECs) and/or with analog controlled quadrature error correctors (AQECs). The ADCCs are used in the transmission circuit 112 to track duty cycle errors when the phase interpolators are rotating. The ADCCs can keep up with tracking the duty cycle errors when the phase interpolators are rotating. In some embodiments, the receiver circuit 114 includes digitally controlled duty cycle correctors (DDCCs) with DQECs and/or with AQECs. The DDCCs are used in the receiver circuit 114 to store duty cycle correction codes for adjusting duty cycles even if clock signals are temporarily not available. Also, the differential to quadrature phase generators disclosed herein can be used in different technology nodes.

Figure 5:
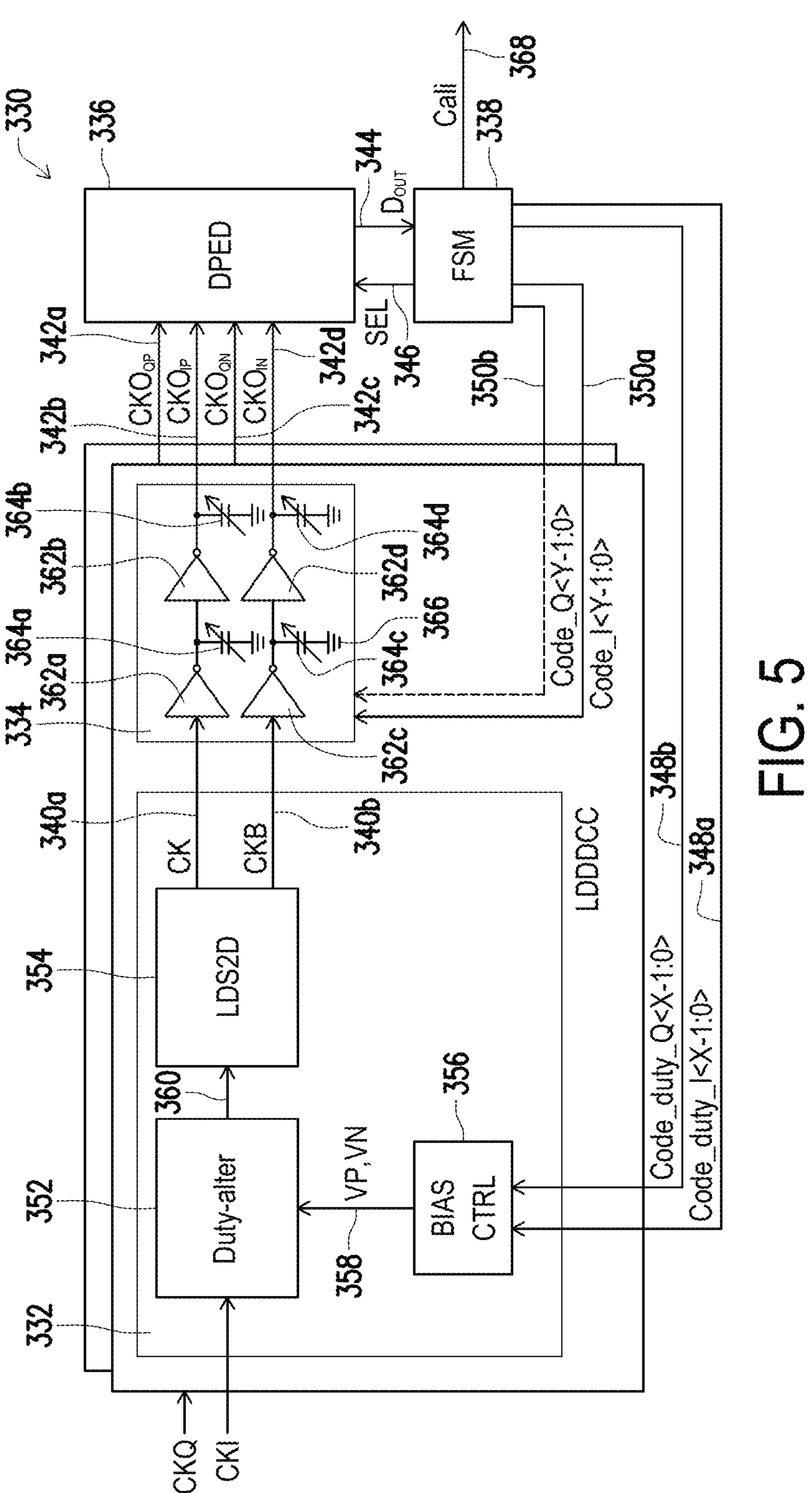
FIG. 5 is a diagram schematically illustrating a differential to quadrature phase generator that includes a low distortion digitally controlled duty cycle corrector (LDDDCC) and a digitally controlled quadrature error corrector (DQEC), in accordance with some embodiments.

FIG. 5 is a diagram schematically illustrating a differential to quadrature phase generator 330 that includes a low distortion digitally controlled duty cycle corrector (LDDDCC) 332 and a DQEC 334, in accordance with some embodiments. The differential to quadrature phase generator 330 includes chopping offset cancelation and the LDDDCC 332 provides PVT immunity. The LDDDCC 332 stores duty cycle correction codes for correcting or adjusting duty cycles even if the clock signals are lost or temporarily not available, where in contrast an analog duty cycle corrector may lose its correction voltages if the clock signals are lost or temporarily not available. In some embodiments, the differential to quadrature phase generator 330 is like the receiver differential to quadrature phase generator 86 shown in FIG. 2. In some embodiments, the differential to quadrature phase generator 330 is like the receiver differential to quadrature phase generator 282 shown in FIG. 4. In some embodiments, the differential to quadrature phase generator 330 may be used in a transmission circuit, such as transmission circuit 22 shown in FIG. 1 and/or transmission circuit 112 shown in FIG. 3.

The differential to quadrature phase generator 330 includes the LDDDCC 332, the DQEC 334, a duty cycle and phase error detector (DPED) 336, and a finite state machine (FSM) 338. The LDDDCC 332 is electrically connected to the DQEC 334 by differential clock signal paths 340*a* and 340*b*, and the DQEC 334 is electrically connected to the DPED 336 by quadrature phase clock signal paths 342*a*-342*d*. The DPED 336 is electrically connected to the FSM 338 by a data output signal path 344 and a select signal path 346, and the FSM 338 is electrically connected to the LDDDCC 332 by duty cycle code paths 348*a* and 348*b* and to DQEC 334 by quadrature phase code paths 350*a* and 350*b*.

The LDDDCC 332 receives two clock signals CKI and CKQ, such as clock phases of 45 degrees and 135 degrees. The LDDDCC 332 corrects the duty cycles of the two clock signals CKI and CKQ and generates differential clock signals CK and CKB for each of the two clock signals CKI and CKQ. The LDDDCC 332 includes a duty cycle alteration circuit 352, a low distortion signal to differential signal generator (LDS2D) 354, and a bias control circuit 356, such as a current bias control circuit. In some embodiments, the LDDDCC 332 includes multiple duty cycle alteration circuits 352, multiple LDS2Ds 354, and/or multiple bias control circuits 356 for generating the differential clock signals CK and CKB for each of the received clock signals CKI and CKQ.

The duty cycle alteration circuit 352 is electrically connected to the bias control circuit 356 by bias control signal path 358 and to the LDS2D 354 by duty cycle corrected signal path 360. The LDS2D 354 is electrically connected to the DQEC 334 by the differential clock signal paths 340*a* and 340*b*.

The duty cycle alteration circuit 352 receives the clock signals CKI and CKQ and corrects the duty cycles of the clock signals CKI and CKQ based on bias control signals VP and VN provided by the bias control circuit 356 on the bias control signal path 358. The bias control circuit 356 receives duty cycle correction code Code_duty_I on duty cycle code path 348*a* and duty cycle correction code Code_duty_Q on duty cycle code path 348*b*. The bias control circuit 356 stores the codes and provides the bias control signals VP and VN to the duty cycle alteration circuit 352 that corrects the duty cycles of the clock signals CKI and CKQ. The LDS2D 354 receives the duty cycle corrected signals on the duty cycle corrected signal path 360 and provides the differential clock signals CK and CKB on the differential clock signal paths 340*a* and 340*b*, respectively. In some embodiments, the clock signals CKI and CKQ are at 45 degrees and 135 degrees, respectively. Also, in some embodiments, the duty cycles of the clock signals CKI and CKQ are corrected to provide 50% duty cycles.

The DQEC 334 includes inverters 362*a*-362*d* and variable capacitors 364*a*-364*d* for adjusting the phases of the received differential clock signals CK and CKB to provide quadrature phase signals on the quadrature phase clock signal paths 342*a*-342*d*. First inverter 362*a* includes a first input that receives the clock signal CK and a first output that is electrically connected to one end of the first variable capacitor 364*a* and to a second input of the second inverter 362*b*. A second output of the second inverter 362*b* is electrically connected to one end of the second variable capacitor 364*b* and to the DPED 336 by quadrature phase clock signal path 342*b*. Third inverter 362*c* includes a third input that receives the clock signal CKB and a third output that is electrically connected to one end of the third variable capacitor 364*c* and to a fourth input of the fourth inverter 362*d*. A fourth output of the fourth inverter 362*d* is electrically connected to one end of the fourth variable capacitor 364*d* and to the DPED 336 by quadrature phase clock signal path 342*d*. Each of the other ends of the variable capacitors 364*a*-364*d* is electrically connected to a reference 366, such as ground.

In some embodiments, the DQEC 334 includes more than four inverters 362*a*-362*d*, including more than two inverters in series, and more than four capacitors 364*a*-364*d* for correcting the phases of the received differential clock signals CK and CKB. In some embodiments, the DQEC 334 includes multiple sets of inverters 362*a*-362*d* and multiple sets of variable capacitors 364*a*-364*d* for correcting the phases of received differential clock signals, such as clock signals CK and CKB, to provide the quadrature phase signals on the quadrature phase clock signal paths 342*a*-342*d*.

The DQEC 334 receives the differential clock signals CK and CKB and provides quadrature phase corrected signals $CKO_{QP}$, $CKO_{IP}$, $CKO_{QN}$, $CKO_{IN}$ to the DPED 336 on the quadrature phase clock signal paths 342*a*-342*d*, respectively. The quadrature phase corrected signals $CKO_{QP}$ and $CKO_{QN}$ are 180 degrees out of phase with each other and the quadrature phase corrected signals $CKO_{IP}$ and $CKO_{IN}$ are 180 degrees out of phase with each other. The DQEC 334 receives the differential clock signals CK and CKB for each of the clock signals CKI and CKQ and adjusts the phase difference between the received differential clock signals CK and CKB to provide the quadrature phase corrected signals $CKO_{QP}$, $CKO_{IP}$, $CKO_{QN}$, $CKO_{IN}$ based on phase correction code Code_I on quadrature phase code path 350*a* and phase correction code Code_Q on quadrature phase code paths 350*b*. The DQEC 334 receives the phase correction codes and adjusts the variable capacitors 364*a*-364*d* to correct the clock phases and provide the quadrature phase corrected signals $CKO_{QP}$, $CKO_{IP}$, $CKO_{QN}$, $CKO_{IN}$ to the DPED 336 on the quadrature phase clock signal paths 342*a*-342*d*, respectively. In some embodiments, to correct the quadrature phases, the correction code Code_I on quadrature phase code path 350*a* remains unchanged, and the correction code Code_Q on quadrature phase code path 350*b* is changed to correct the phase differences. Also, in some embodiments, the quadrature phase corrected signals $CKO_{QP}$, $CKO_{IP}$, $CKO_{QN}$, $CKO_{IN}$ are 135 degrees, 45 degrees, 315 degrees, and 225 degrees, respectively.

The DPED 336 receives the quadrature phase corrected signals $CKO_{QP}$, $CKO_{IP}$, $CKO_{QN}$, $CKO_{IN}$ and detects duty cycle errors and phase errors. The DPED 336 provides data Dout to the FSM 338 by the data output signal path 344, and the FSM 338 provides the duty cycle correction codes Code_duty_I and Code_duty_Q and the phase correction codes Code_I and Code_Q. Also, the FSM 338 provides a select signal SEL to the DPED 336 to switch chopping circuits in the DPED 336, which provides offset cancelation for the received quadrature phase corrected signals $CKO_{QP}$, $CKO_{IP}$, $CKO_{QN}$, $CKO_{IN}$ in the DPED 336. In addition, the FSM 338 provides a calibration done signal Cali on calibration output path 368 to indicate that a calibration has been performed and completed.

Figure 6:
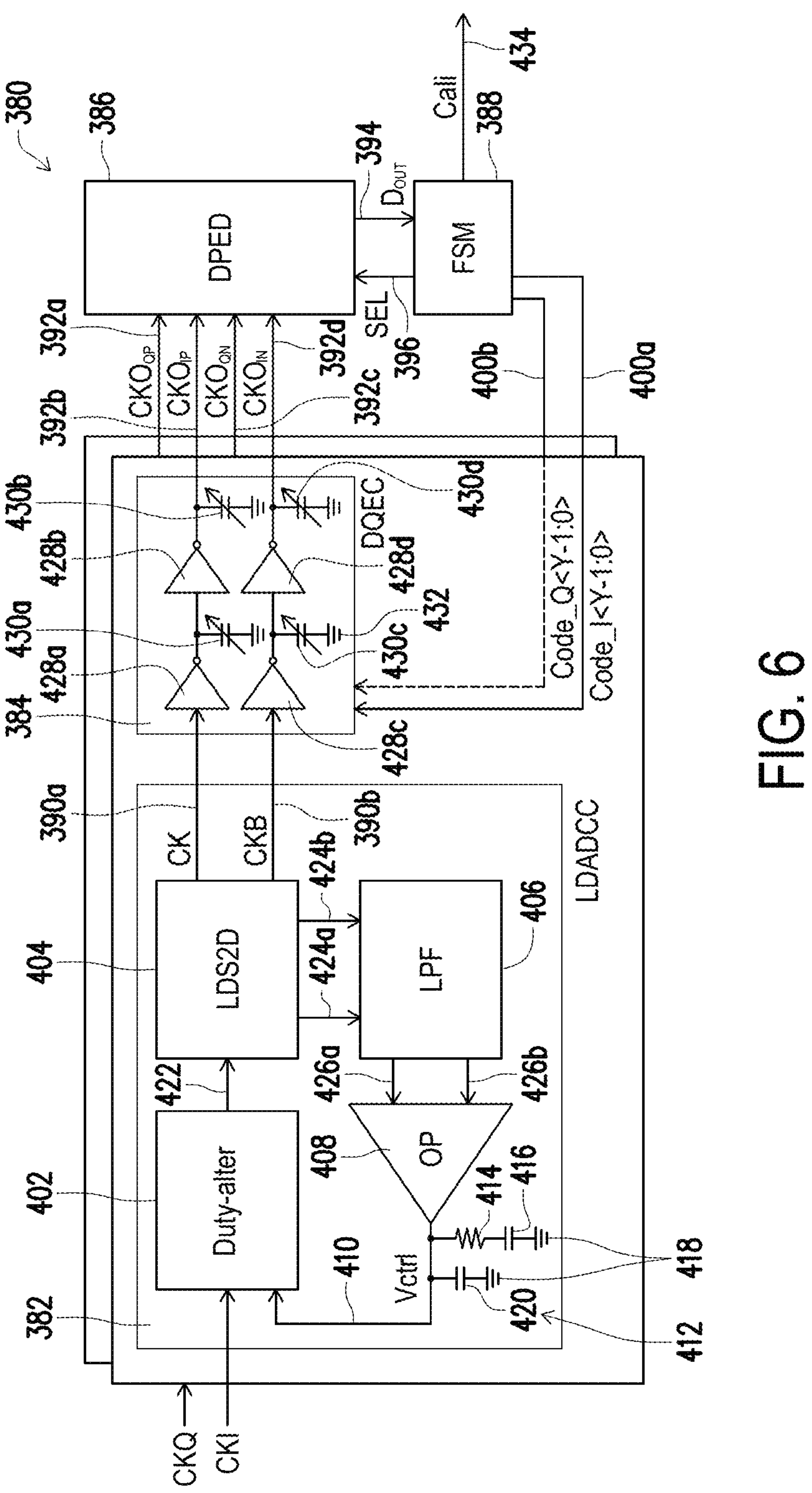
FIG. 6 is a diagram schematically illustrating a differential to quadrature phase generator that includes a low distortion analog duty cycle corrector (LDADCC) and a DQEC, in accordance with some embodiments.

FIG. 6 is a diagram schematically illustrating a differential to quadrature phase generator 380 that includes a low distortion analog duty cycle corrector (LDADCC) 382 and a DQEC 384, in accordance with some embodiments. The differential to quadrature phase generator 380 includes chopping offset cancelation and the LDADCC 382 provides PVT immunity. The LDADCC 382 is used in the transmission circuit 112. The LDADCC 382 tracks duty cycle errors when the phase interpolators 158 are rotating. The LDADCC 382 can keep up with tracking the duty cycle errors when the phase interpolators 158 are rotating. In some embodiments, the differential to quadrature phase generator 380 is like at least part of the transmission differential to quadrature phase generator 44 shown in FIG. 1. In some embodiments, the differential to quadrature phase generator 380 is like at least part of the transmission differential to quadrature phase generator 160 shown in FIG. 3. In some embodiments, the differential to quadrature phase generator 380 may be used in a receiver circuit, such as receiver circuit 24 shown in FIG. 2 and/or receiver circuit 114 shown in FIG. 4.

The differential to quadrature phase generator 380 includes the LDADCC 382, the DQEC 384, a DPED 386, and an FSM 388. The LDADCC 382 is electrically connected to the DQEC 384 by differential clock signal paths 390*a* and 390*b*, and the DQEC 384 is electrically connected to the DPED 386 by quadrature phase clock signal paths 392*a*-392*d*. The DPED 386 is electrically connected to the FSM 388 by a data output signal path 394 and a select signal path 396, and the FSM 388 is electrically connected to the DQEC 384 by quadrature phase code paths 400*a* and 400*b*.

The LDADCC 382 receives two clock signals CKI and CKQ, such as clock phases of 45 degrees and 135 degrees. The LDADCC 382 corrects the duty cycles of the two clock signals CKI and CKQ and generates differential clock signals CK and CKB for each of the two clock signals CKI and CKQ. The LDADCC 382 includes a duty cycle alteration circuit 402, an LDS2D 404, a low pass filter (LPF) 406, and an operational amplifier 408 that has an amplifier output path 410. The amplifier output path 410 is electrically connected to the duty cycle alteration circuit 402.

In some embodiments, the LDADCC 382 includes filter circuits 412 electrically connected to the amplifier output path 410. In some embodiments, the filter circuits 412 include one end of a resistor 414 electrically connected to the output path 410 and the other end of the resistor 414 electrically connected to one end of a first capacitor 416. The other end of the first capacitor 416 is electrically connected to a reference 418, such as ground. In some embodiments, the filter circuits 412 include one end of a second capacitor 420 electrically connected to the output path 410 and the other end of the second capacitor 420 electrically connected to the reference 418, such as ground. In some embodiments, the LDADCC 382 includes multiple duty cycle alteration circuits 402, multiple LDS2Ds 404, multiple LPFs 406, and/or multiple operational amplifiers 408 for generating the differential clock signals CK and CKB for each of the received clock signals CKI and CKQ.

The duty cycle alteration circuit 402 is electrically connected to the LDS2D 404 by duty cycle corrected signal path 422, and the LDS2D 404 is electrically connected to the DQEC 384 by the differential clock signal paths 390*a* and 390*b*. The LPF 406 is electrically connected to the LDS2D 404 by clock signal paths 424*a* and 424*b*, and to the operational amplifier 408 by filtered clock signal paths 426*a* and 426*b*.

The duty cycle alteration circuit 402 receives the clock signals CKI and CKQ and corrects the duty cycles of the clock signals CKI and CKQ based on a control signal Vctrl received from the operational amplifier 408 on the output path 410. The LPF 406 receives clock signals from the LDS2D 404 on the clock signal paths 424*a* and 424*b*, filters the clock signals, and provides filtered clock signal values to the operation amplifier 408 on the filtered clock signal paths 426*a* and 426*b*. The operation amplifier 408 provides the control signal Vctrl on the output path 410 to the duty cycle alteration circuit 402. The LDS2D 404 receives the duty cycle corrected signals on the duty cycle corrected signal path 422 and provides the differential clock signals CK and CKB on the differential clock signal paths 390*a* and 390*b*, respectively. In some embodiments, the clock signals CKI and CKQ are at 0 degrees and 90 degrees, respectively. In some embodiments, the clock signals CKI and CKQ are at 45 degrees and 135 degrees, respectively. Also, in some embodiments, the duty cycles of the clock signals CKI and CKQ are corrected to provide 50% duty cycles.

The DQEC 384 includes inverters 428*a*-428*d* and variable capacitors 430*a*-430*d* for adjusting the phases of the received differential clock signals CK and CKB to provide quadrature phase signals on the quadrature phase clock signal paths 392*a*-392*d*. First inverter 428*a* includes a first input that receives the clock signal CK and a first output that is electrically connected to one end of the first variable capacitor 430*a* and to a second input of the second inverter 428*b*. A second output of the second inverter 428*b* is electrically connected to one end of the second variable capacitor 430*b* and to the DPED 386 by quadrature phase clock signal path 392*b*. Third inverter 428*c* includes a third input that receives the clock signal CKB and a third output that is electrically connected to one end of the third variable capacitor 430*c* and to a fourth input of the fourth inverter 428*d*. A fourth output of the fourth inverter 428*d* is electrically connected to one end of the fourth variable capacitor 430*d* and to the DPED 386 by quadrature phase clock signal path 392*d*. Each of the other ends of the variable capacitors 430*a*-430*d* is electrically connected to a reference 432, such as ground.

In some embodiments, the DQEC 384 includes more than four inverters 428*a*-428*d*, including more than two inverters in series, and more than four capacitors 430*a*-430*d* for correcting the phases of the received differential clock signals CK and CKB. In some embodiments, the DQEC 384 includes multiple sets of inverters 428*a*-428*d* and multiple sets of variable capacitors 430*a*-430*d* for correcting the phases of received differential clock signals, such as clock signals CK and CKB, to provide the quadrature phase signals on the quadrature phase clock signal paths 392*a*-392*d*.

The DQEC 384 receives the differential clock signals CK and CKB and provides quadrature phase corrected signals $CKO_{QP}$, $CKO_{IP}$, $CKO_{QN}$, $CKO_{IN}$ to the DPED 386 on the quadrature phase clock signal paths 392*a*-392*d*, respectively. The quadrature phase corrected signals $CKO_{QP}$ and $CKO_{QN}$ are 180 degrees out of phase with each other and the quadrature phase corrected signals $CKO_{IP}$ and $CKO_{IN}$ are 180 degrees out of phase with each other. The DQEC 384 receives the differential clock signals CK and CKB for each of the clock signals CKI and CKQ and adjusts the phase difference between the received differential clock signals CK and CKB to provide the quadrature phase corrected signals $CKO_{QP}$, $CKO_{IP}$, $CKO_{QN}$, $CKO_{IN}$ based on phase correction codes Code_I on quadrature phase code path 400*a* and Code_Q on quadrature phase code paths 400*b*. The DQEC 384 receives the phase correction codes and adjusts the variable capacitors 430*a*-430*d* to correct the clock phases and provide the quadrature phase corrected signals $CKO_{QP}$, $CKO_{IP}$, $CKO_{QN}$, $CKO_{IN}$ to the DPED 386 on the quadrature phase clock signal paths 392*a*-392*d*, respectively. In some embodiments, to correct the quadrature phases, the correction code Code_I on quadrature phase code path 400*a* remains unchanged, and the correction code Code_Q on quadrature phase code path 400*b* is changed to correct the phase differences. Also, in some embodiments, the quadrature phase corrected signals $CKO_{QP}$, $CKO_{IP}$, $CKO_{QN}$, $CKO_{IN}$ are 90 degrees, 0 degrees, 270 degrees, and 180 degrees, respectively. Also, in some embodiments, the quadrature phase corrected signals $CKO_{QP}$, $CKO_{IP}$, $CKO_{QN}$, $CKO_{IN}$ are 135 degrees, 45 degrees, 315 degrees, and 225 degrees, respectively.

The DPED 386 receives the quadrature phase corrected signals $CKO_{QP}$, $CKO_{IP}$, $CKO_{QN}$, $CKO_{IN}$ and detects duty cycle errors and phase errors. The DPED 386 provides data Dout to the FSM 388 by the data output signal path 394, and the FSM 388 provides the phase correction codes Code_I on quadrature phase code path 400*a* and Code_Q on quadrature phase code path 400*b*. Also, the FSM 388 provides a select signal SEL to the DPED 386 to switch chopping circuits in the DPED 386, which provides offset cancelation for the received quadrature phase corrected signals $CKO_{QP}$, $CKO_{IP}$, $CKO_{QN}$, $CKO_{IN}$ in the DPED 386. In addition, the FSM 388 provides a calibration done signal Cali on calibration output path 434 to indicate that a calibration has been performed and completed.

Figure 7:
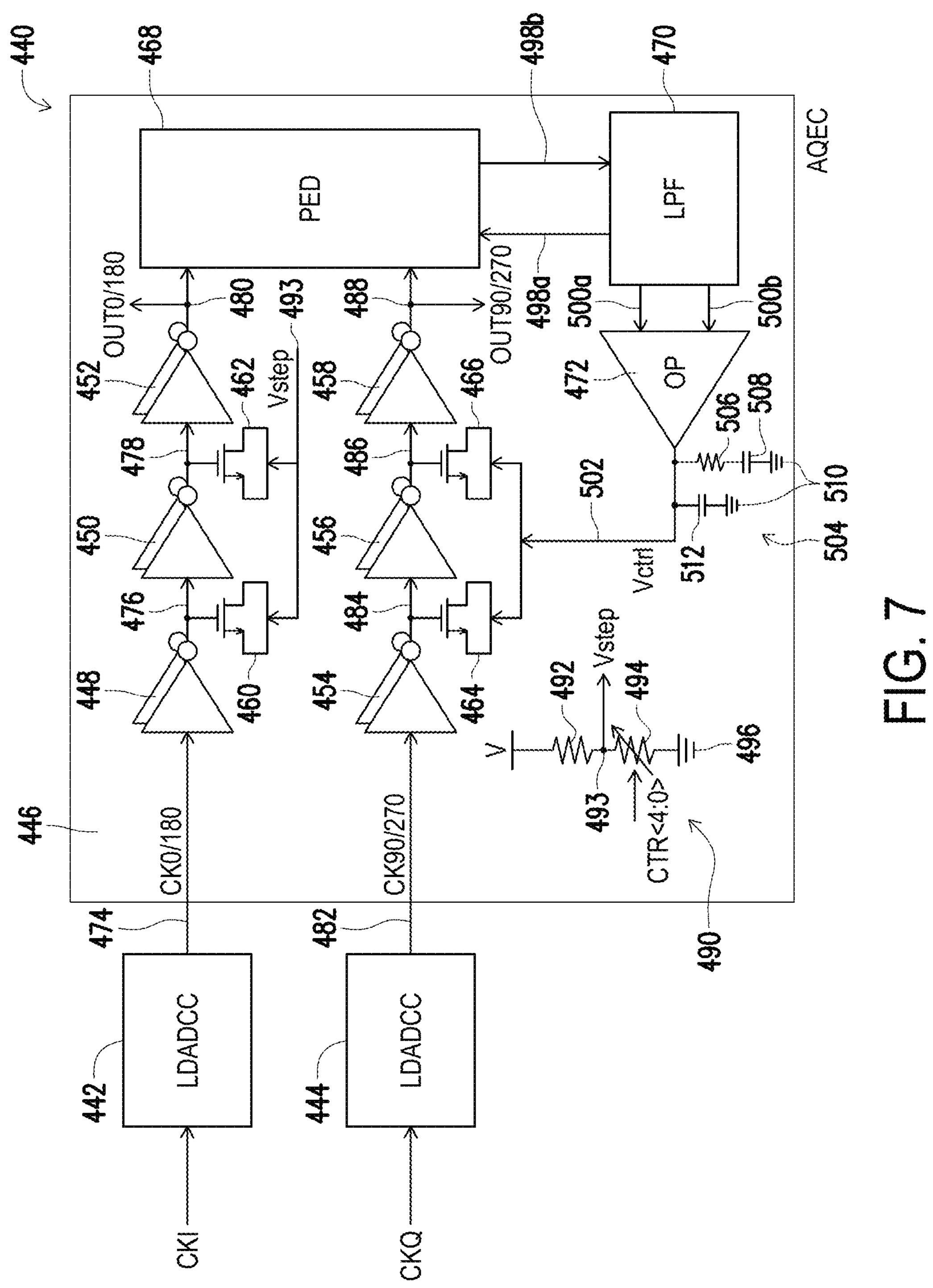
FIG. 7 is a diagram schematically illustrating a differential to quadrature phase generator that includes two LDADCCs and an analog quadrature error corrector (AQEC), in accordance with some embodiments.

FIG. 7 is a diagram schematically illustrating a differential to quadrature phase generator 440 that includes LDADCC 442, LDADCC 444, and an AQEC 446, in accordance with some embodiments. In some embodiments, the differential to quadrature phase generator 440 with the LDADCCs 442 and 444 and the AQEC 446 is used in the transmission circuit 112. In some embodiments, the LDADCCs 442 and 444 are replaced with LDDDCCs and the differential to quadrature phase generator 440 with the LDDDCCs and the AQEC 446 is used in the receiver circuit 114.

The AQEC 446 includes first inverters 448, second inverters 450, third inverters 452, fourth inverters 454, fifth inverters 456, sixth inverters 458, first metal-oxide semiconductor field-effect transistor (MOSFET) capacitor 460, second MOSFET capacitor 462, third MOSFET capacitor 464, and fourth MOSFET capacitor 466. Also, the AQEC 446 includes a phase error detector (PED) 468, an LPF 470, and an operational amplifier 472.

The first inverters 448 are electrically connected to the LDADCC 442 by duty cycle corrected clock signal path 474 and to an input of the second inverters 450 and a gate of the first MOSFET capacitor 460 by first inverter output path 476. The second inverters 450 are electrically connected to an input of the third inverters 452 and a gate of the second MOSFET capacitor 462 by second inverter output path 478. The third inverters 452 are electrically connected to the PED 468 by third inverter output path 480.

The fourth inverters 454 are electrically connected to the LDADCC 444 by duty cycle corrected clock signal path 482 and to an input of the fifth inverters 456 and a gate of the third MOSFET capacitor 464 by fourth inverter output path 484. The fifth inverters 456 are electrically connected to an input of the sixth inverters 458 and a gate of the fourth MOSFET capacitor 466 by fifth inverter output path 486. The sixth inverters 458 are electrically connected to the PED 468 by sixth inverter output path 488.

The AQEC 446 includes a step voltage circuit 490 that includes a resistor 492 and a variable resistor 494 connected in series to one another. One end of the resistor 492 is electrically connected to a power voltage V and the other end is electrically connected to one end of the variable resistor 494 at output path 493. The other end of the variable resistor 494 is electrically connected to a reference 496, such as ground. The variable resistor 494 is controlled by a control circuit (not shown) that provides control signal CTR to the variable resistor 494. The step voltage circuit 490 provides an output control signal Vstep on the output path 493 that is electrically connected to the drain and source regions of the first MOSFET capacitor 460 and the second MOSFET capacitor 462 to correct or adjust the quadrature clock phases of the clock signals CK0/180 to OUT0/180.

The LPF 470 is electrically connected to the PED 468 by phase detector paths 498*a* and 498*b*, and to the operational amplifier 472 by filtered phase detector paths 500*a* and 500*b*. The amplifier output path 502 is electrically connected to the drain and source regions of the third MOSFET capacitor 464 and the fourth MOSFET capacitor 466. The operational amplifier 472 provides a control signal Vctrl to the drain and source regions of the third MOSFET capacitor 464 and the fourth MOSFET capacitor 466 to correct or adjust the quadrature clock phases of the clock signals CK90/270 to OUT90/270. In some embodiments, the output control signal Vstep is maintained relatively constant, while the control signal Vctrl is adjusted to correct the quadrature clock phases CK90/270 to OUT90/270.

In some embodiments, the AQEC 446 includes filter circuits 504 electrically connected to the amplifier output path 502. In some embodiments, the filter circuits 504 include one end of a resistor 506 electrically connected to the output path 502 and the other end of the resistor 506 electrically connected to one end of a first capacitor 508. The other end of the first capacitor 508 is electrically connected to a reference 510, such as ground. In some embodiments, the filter circuits 504 include one end of a second capacitor 512 electrically connected to the output path 502 and the other end of the second capacitor 512 electrically connected to the reference 510, such as ground.

In operation, the LDADCC 442 receives a clock signal CKI, duty cycle corrects the clock signal CKI, and generates differential clock signals CK0/180. The inverters 448, 450, and 452 receive the differential clock signals CK0/180 and provide output clock signals OUT0/180 to the PED 468. The LDADCC 444 receives a clock signal CKQ, duty cycle corrects the clock signal CKQ, and generates differential clock signals CK90/270. The inverters 454, 456, and 458 receive the differential clock signals CK90/270 and provide output clock signals OUT90/270 to the PED 468.

The PED 468 detects phase errors in the received signals OUT0/180 and OUT90/270 and provides phase detection signals, such as XOR and XNOR signals, to the LPF 470. The LPF 470 low pass filters the phase detection signals and provides corresponding voltage signals to the operational amplifier 472. The operational amplifier 472 detects the difference in the received voltage signals and provides a control signal VCtrl to the drain and source regions of the third MOSFET capacitor 464 and the fourth MOSFET capacitor 466 to correct the quadrature clock phases of the clock signals CK90/270 to OUT90/270.

Figure 8:
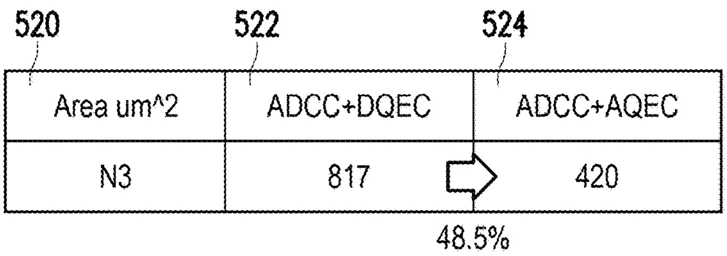
FIG. 8 is a diagram schematically illustrating the integrated circuit area used by a differential to quadrature phase generator that includes an ADCC+DQEC and a differential to quadrature phase generator that includes an ADCC+AQEC, in accordance with some embodiments.

FIG. 8 is a diagram schematically illustrating the integrated circuit area 520 used by a differential to quadrature phase generator that includes an ADCC+DQEC 522 and a differential to quadrature phase generator that includes an ADCC+AQEC 524, in accordance with some embodiments. For process node N3, the area for the differential to quadrature phase generator that includes an ADCC+DQEC is 817 micrometers squared ($um^2$) and the area for the differential to quadrature phase generator that includes an ADCC+AQEC is 420 $um^2$. Thus, using the differential to quadrature phase generator that includes an ADCC+AQEC, instead of the differential to quadrature phase generator that includes an ADCC+DQEC, results in an area savings of about 48.5%.

Figure 9:
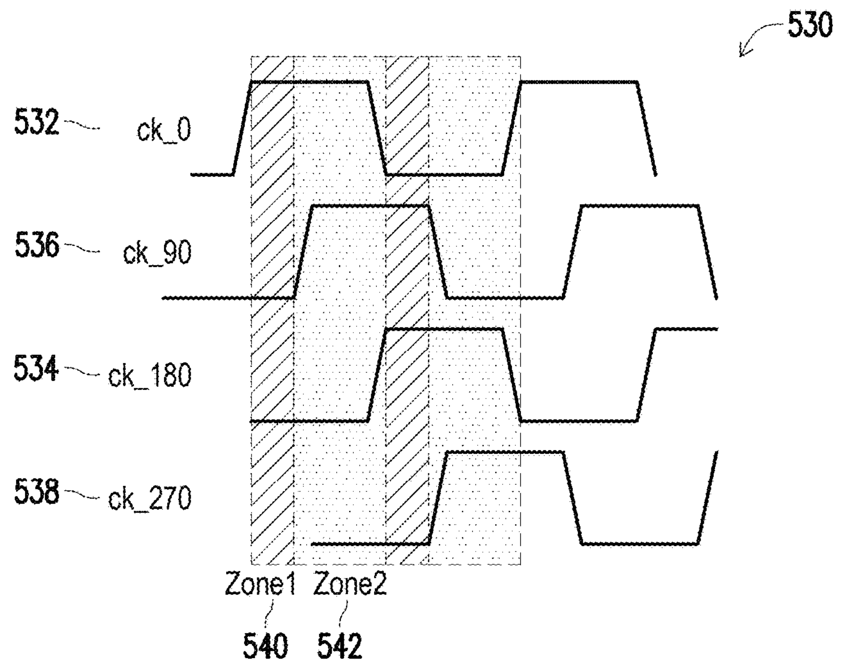
FIG. 9 is a diagram schematically illustrating quadrature clock waveforms, in accordance with some embodiments.

FIG. 9 is a diagram schematically illustrating quadrature clock waveforms 530, in accordance with some embodiments. In this example, clock phase ck_0 532 and clock phase ck_180 534 are fully differential clock signals that are 180 degrees out of phase with each other. Also, clock phase ck_90 536 and clock phase ck_270 538 are fully differential clock signals that are 180 degrees out of phase with each other. However, the clock phase ck_0 532 and the clock phase ck_90 536 are less than 90 degrees out of phase with each other, which is a clock phase error to be corrected. The difference between the clock phase ck_0 532 and the clock phase ck_90 536 is indicated by zone 1 540 and zone 2 542, where zone 1 540 is thinner than zone 2 542, such that the zones 1 and 2 540 and 542 are not the same width. In some embodiments, the PED 468 shown in FIG. 7 is configured to detect the phase difference between the clock phase ck_0 532 and the clock phase ck_90 536.

Figure 10:
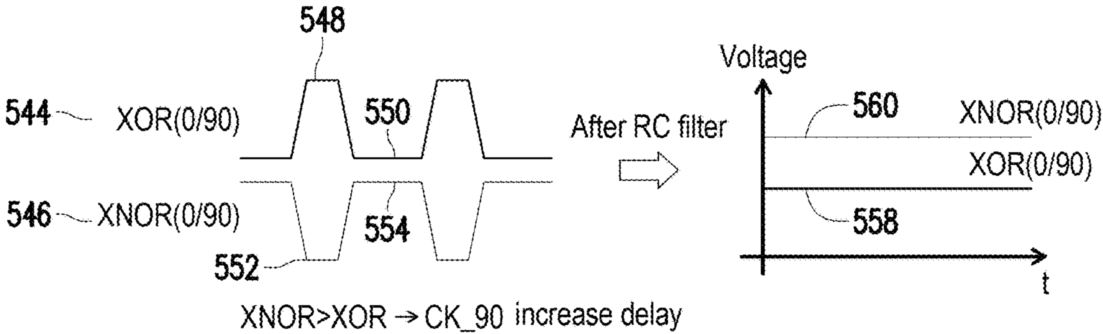
FIG. 10 is a diagram schematically illustrating an XOR function waveform and an XNOR function waveform of the clock phase ck_0 and the clock phase ck_90, in accordance with some embodiments.

FIG. 10 is a diagram schematically illustrating an XOR function waveform 544 and an XNOR function waveform 546 of the clock phase ck_0 532 and the clock phase ck_90 536, in accordance with some embodiments. The XOR function waveform 544 includes a thinner high voltage value 548 and a wider low voltage value 550, while the XNOR function waveform 546 includes a thinner low voltage value 552 and a wider high voltage value 554. In some embodiments, the PED 468 performs an XOR function and an XNOR function on the clock phase ck_0 532 and the clock phase ck_90 536.

Figure 11:
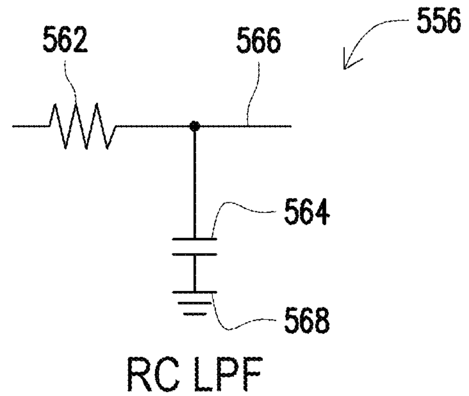
FIG. 11 is a diagram schematically illustrating one example of a LPF that the XOR function waveform and the XNOR function waveform are passed through to generate a DC XOR voltage value and a DC XNOR voltage value, in accordance with some embodiments.

FIG. 11 is a diagram schematically illustrating a LPF 556 that the XOR function waveform 544 and the XNOR function waveform 546 are passed through to generate a DC XOR voltage value 558 and a DC XNOR voltage value 560, in accordance with some embodiments. The LPF 556 includes a resistor 562 and a capacitor 564. One end of the resistor 562 is electrically connected to receive a waveform, such as the XOR function waveform 544 or the XNOR function waveform 546, and the other end of the resistor 562 is electrically connected to one end of the capacitor 564 at filter output path 566. The other end of the capacitor 564 is electrically connected to a reference 568, such as ground.

In reference to FIG. 10, the XOR function waveform 544 and the XNOR function waveform 546 are passed through filters, such as the LPF 556, to generate the DC XOR voltage value 558 and the DC XNOR voltage value 560. In this example, the DC XNOR voltage value 560 is greater than the DC XOR voltage value 558. To correct the quadrature clock phases 530, the clock phase ck_90 and the clock phase ck_270 are delayed.

Figure 12:
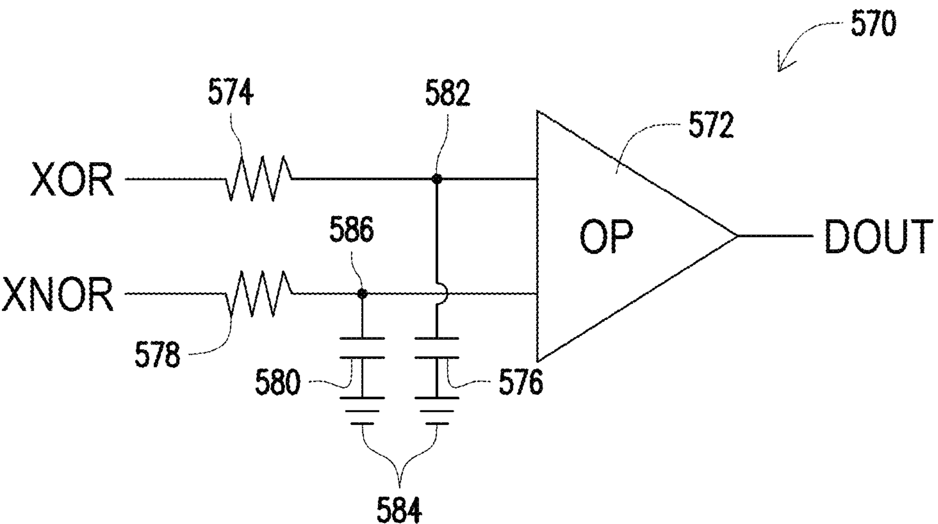
FIG. 12 is a diagram schematically illustrating an operational amplifier circuit that receives the DC XOR voltage value and the DC XNOR voltage value and generates a corresponding voltage output value DOUT, in accordance with some embodiments.

FIG. 12 is a diagram schematically illustrating an operational amplifier circuit 570 that receives the DC XOR voltage value 558 and the DC XNOR voltage value 560 and generates a corresponding voltage output value DOUT, in accordance with some embodiments. The voltage output value DOUT is used to correct the quadrature clock phases 530. In some embodiments, the voltage output value DOUT is provided to the third and fourth MOSFET capacitors 464 and 466 to correct the quadrature clock phases 530.

The operational amplifier circuit 570 includes an operation amplifier 572, a first resistor 574, a first capacitor 576, a second resistor 578, and a second capacitor 580. One end of the first resistor 574 is electrically connected to receive the XOR function waveform 544, and the other end of the first resistor 574 is electrically connected to one end of the first capacitor 576 at first input path 582. The other end of the first capacitor 576 is electrically connected to a reference 584, such as ground. One end of the second resistor 578 is electrically connected to receive the XNOR function waveform 546, and the other end of the second resistor 578 is electrically connected to one end of the second capacitor 580 at second input path 586. The other end of the second capacitor 580 is electrically connected to the reference 584. In some embodiments, the operational amplifier 572 is like the operational amplifier 472.

Figures 13, 14:
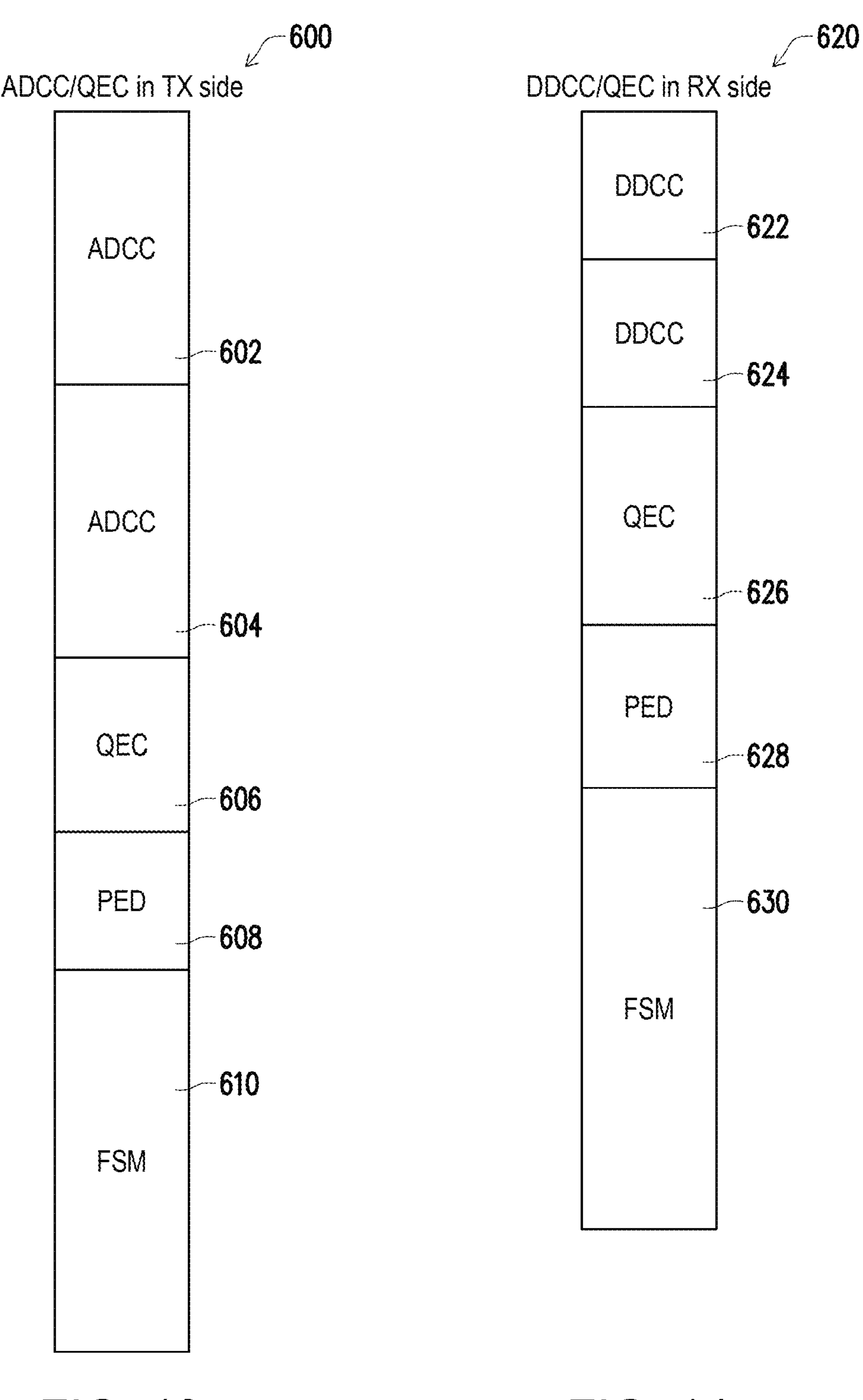
FIG. 13 is a diagram schematically illustrating an integrated circuit layout of a differential to quadrature phase generator for the transmission side of a UCIE communication circuit, in accordance with some embodiments.
FIG. 14 is a diagram schematically illustrating an integrated circuit layout of a differential to quadrature phase generator for the receiver side of a UCIE communication circuit, in accordance with some embodiments.

FIG. 13 is a diagram schematically illustrating an integrated circuit layout of a differential to quadrature phase generator 600 for the transmission side of a UCIE communication circuit, in accordance with some embodiments. The differential to quadrature phase generator 600 includes two ADCCs 602 and 604, a QEC 606, a PED 608, and an FSM 610. In some embodiments, the QEC 606 is a DQEC like the DQEC 384 shown in FIG. 6. In other embodiments, the QEC 606 can be an AQEC like the AQEC 446 shown in FIG. 7.

In this example, the integrated circuit layout is in a process node N3P. In some embodiments, the differential to quadrature phase generator 600 is like at least part of the transmission differential to quadrature phase generator 44 in the transmission circuit 22 of FIG. 1. In some embodiments, the differential to quadrature phase generator 600 is like at least part of the transmission differential to quadrature phase generator 160 in the transmission circuit 112 of FIG. 3. In some embodiments, the differential to quadrature phase generator 600 is like the differential to quadrature phase generator 380 of FIG. 6.

FIG. 14 is a diagram schematically illustrating an integrated circuit layout of a differential to quadrature phase generator 620 for the receiver side of a UCIE communication circuit, in accordance with some embodiments. The differential to quadrature phase generator 620 includes two DDCCs 622 and 624, a QEC 626, a PED 628, and an FSM 630. In some embodiments, the QEC 626 is a DQEC like the DQEC 334 shown in FIG. 5. In other embodiments, the QEC 626 can be an AQEC like the AQEC 446 shown in FIG. 7.

In this example, the integrated circuit layout is in a process node N3P. In some embodiments, the differential to quadrature phase generator 620 is like at least part of the receiver differential to quadrature phase generator 86 in the receiver circuit 24 of FIG. 2. In some embodiments, the differential to quadrature phase generator 620 is like at least part of the receiver differential to quadrature phase generator 282 in the receiver circuit 114 of FIG. 4. In some embodiments, the differential to quadrature phase generator 620 is like the differential to quadrature phase generator 330 of FIG. 5.

Figure 15:
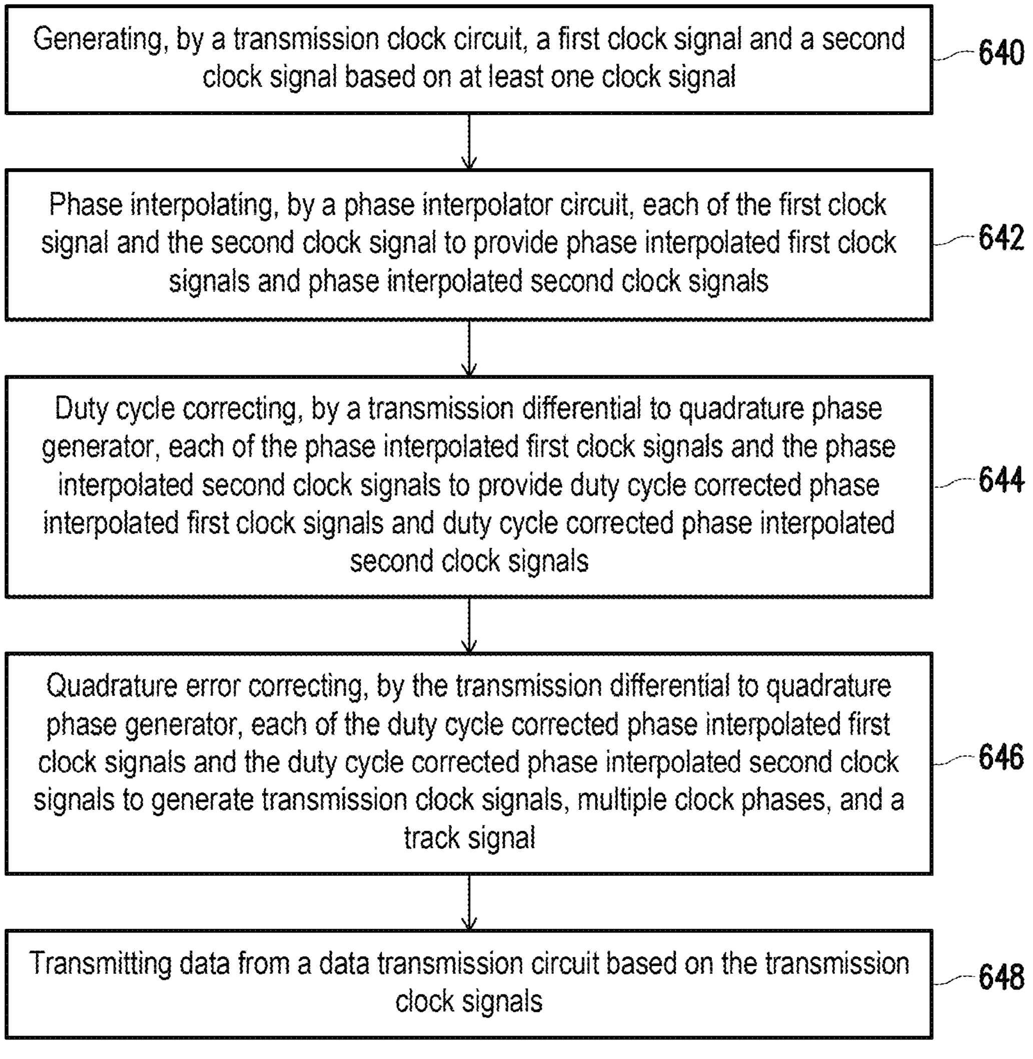
FIG. 15 is a diagram schematically illustrating a method of operating a communication circuit that includes at least one differential to quadrature phase generator, in accordance with some embodiments.

FIG. 15 is a diagram schematically illustrating a method of operating a communication circuit that includes at least one differential to quadrature phase generator, in accordance with some embodiments. The differential to quadrature phase generator is like one or more of the differential to quadrature phase generators described herein.

In some embodiments, the differential to quadrature phase generator is like at least part of the transmission differential to quadrature phase generator 44 in the transmission circuit 22 of FIG. 1. In some embodiments, the differential to quadrature phase generator is like at least part of the transmission differential to quadrature phase generator 160 in the transmission circuit 112 of FIG. 3. In some embodiments, the differential to quadrature phase generator is like the differential to quadrature phase generator 380 of FIG. 6.

In some embodiments, the differential to quadrature phase generator is like at least part of the receiver differential to quadrature phase generator 86 in the receiver circuit 24 of FIG. 2. In some embodiments, the differential to quadrature phase generator is like at least part of the receiver differential to quadrature phase generator 282 in the receiver circuit 114 of FIG. 4. In some embodiments, the differential to quadrature phase generator is like the differential to quadrature phase generator 330 of FIG. 5.

At step 640, the method includes generating, by a transmission clock circuit, a first clock signal and a second clock signal based on at least one clock signal, and at step 642, the method includes phase interpolating, by a phase interpolator circuit, each of the first clock signal and the second clock signal to provide phase interpolated first clock signals and phase interpolated second clock signals.

At step 644, the method includes duty cycle correcting, by a transmission differential to quadrature phase generator, each of the phase interpolated first clock signals and the phase interpolated second clock signals to provide duty cycle corrected phase interpolated first clock signals and duty cycle corrected phase interpolated second clock signals. In some embodiments, duty cycle correcting, by the transmission differential to quadrature phase generator, includes duty cycle correcting by a duty cycle corrector, and quadrature error correcting, by the transmission differential to quadrature phase generator, includes quadrature error correcting by a quadrature error corrector.

At step 646, the method includes quadrature error correcting, by the transmission differential to quadrature phase generator, each of the duty cycle corrected phase interpolated first clock signals and the duty cycle corrected phase interpolated second clock signals to generate transmission clock signals, multiple clock phases, and a track signal. At step 648, the method includes transmitting data from a data transmission circuit based on the transmission clock signals.

In some embodiments, the method includes receiving, by a receiver clock circuit, the multiple clock phases and the track signal; providing clock phase signals based on the multiple clock phases; generating, by a track circuit, track signals based on the track signal; duty cycle correcting, by a receiver differential to quadrature phase generator, the clock phase signals to provide duty cycle corrected clock phase signals; quadrature error correcting, by the receiver differential to quadrature phase generator, the duty cycle corrected clock phase signals to generate receiver clock signals; and receiving the data transmitted from the data transmission circuit and outputting the data based on the receiver clock signals.

In some embodiments, duty cycle correcting, by the receiver differential to quadrature phase generator, includes duty cycle correcting by a duty cycle corrector, and quadrature error correcting, by the receiver differential to quadrature phase generator, includes quadrature error correcting by a quadrature error corrector.

Figure 16:
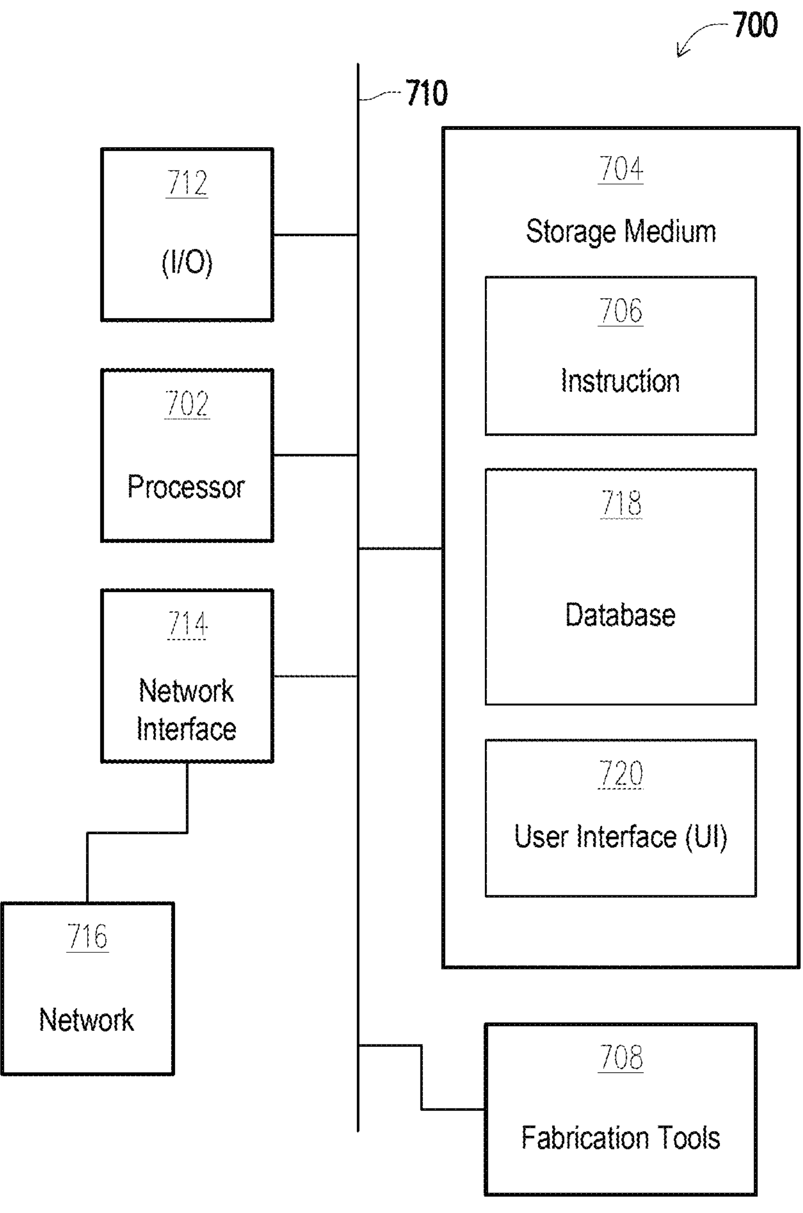
FIG. 16 is a block diagram schematically illustrating an example of a computer system configured to provide the electronic devices, semiconductor devices, and methods of the current disclosure, in accordance with some embodiments.

FIG. 16 is a block diagram schematically illustrating an example of a computer system 700 configured to provide the electronic devices, semiconductor devices, and methods of the current disclosure, in accordance with some embodiments. Some or all the design, layout, and manufacture of the semiconductor devices, also referred to as semiconductor circuits, can be performed by or with the aid of the computer system 700. Also, some or all the design, layout, and manufacture of the electronic devices can be performed by or with the aid of the computer system 700. In some embodiments, the computer system 700 includes an electronic design automation (EDA) system. In some embodiments, the semiconductor devices are ICs.

In some embodiments, the system 700 is a general-purpose computing device including a processor 702 and a non-transitory, computer-readable storage medium 704. The computer-readable storage medium 704 may be encoded with, e.g., store, computer program code such as executable instructions 706. Execution of the instructions 706 by the processor 702 provides (at least in part) a design tool that implements a portion or all the functions of the system 700, such as pre-layout simulations, post-layout simulations, routing, rerouting, and final layout for manufacturing. Further, fabrication tools 708 are included to further layout and physically implement the design and manufacture of the semiconductor devices. In some embodiments, execution of the instructions 706 by the processor 702 provides (at least in part) a design tool that implements a portion or all the functions of the system 700. In some embodiments, the system 700 includes a commercial router. In some embodiments, the system 700 includes an automatic place and route (APR) system.

The processor 702 is electrically coupled to the computer-readable storage medium 704 by a bus 710 and to an I/O interface 712 by the bus 710. A network interface 714 is also electrically connected to the processor 702 by the bus 710. The network interface 714 is connected to a network 716, so that the processor 702 and the computer-readable storage medium 704 can connect to external elements using the network 716. The processor 702 is configured to execute the computer program code or instructions 706 encoded in the computer-readable storage medium 704 to cause the system 700 to perform a portion or all the functions of the system 700, such as providing the semiconductor devices and methods of the current disclosure and other functions of the system 700. In some embodiments, the processor 702 is a central processing unit (CPU), a multi-processor, a distributed processing system, an application specific integrated circuit (ASIC), and/or a suitable processing unit.

In some embodiments, the computer-readable storage medium 704 is an electronic, magnetic, optical, electromagnetic, infrared, and/or semiconductor system or apparatus or device. For example, the computer-readable storage medium 704 can include a semiconductor or solid-state memory, a magnetic tape, a removable computer diskette, a random-access memory (RAM), a read-only memory (ROM), a rigid magnetic disk, and/or an optical disk. In some embodiments using optical disks, the computer-readable storage medium 704 can include a compact disk read only memory (CD-ROM), a compact disk read/write memory (CD-R/W), and/or a digital video disc (DVD).

In some embodiments, the computer-readable storage medium 704 stores computer program code or instructions 706 configured to cause the system 700 to perform a portion or all the functions of the system 700. In some embodiments, the computer-readable storage medium 704 also stores information which facilitates performing a portion or all the functions of the system 700. In some embodiments, the computer-readable storage medium 704 stores a database 718 that includes one or more of component libraries, digital circuit cell libraries, and databases.

The system 700 includes the I/O interface 712, which is coupled to external circuitry. In some embodiments, the I/O interface 712 includes a keyboard, keypad, mouse, trackball, trackpad, touchscreen, and/or cursor direction keys for communicating information and commands to the processor 702.

The network interface 714 is coupled to the processor 702 and allows the system 700 to communicate with the network 716, to which one or more other computer systems are connected. The network interface 714 can include: wireless network interfaces such as BLUETOOTH, WIFI, WIMAX, GPRS, or WCDMA; or wired network interfaces such as ETHERNET, USB, or IEEE-1364. In some embodiments, a portion or all the functions of the system 700 can be performed in two or more systems that are like system 700.

The system 700 is configured to receive information through the I/O interface 712. The information received through the I/O interface 712 includes one or more of instructions, data, design rules, libraries of components and cells, and/or other parameters for processing by the processor 702. The information is transferred to the processor 702 by the bus 710. Also, the system 700 is configured to receive information related to a user interface (UI) through the I/O interface 712. This UI information can be stored in the computer-readable storage medium 704 as a UI 720.

In some embodiments, a portion or all the functions of the system 700 are implemented via a standalone software application for execution by a processor. In some embodiments, a portion or all the functions of the system 700 are implemented in a software application that is a part of an additional software application. In some embodiments, a portion or all the functions of the system 700 are implemented as a plug-in to a software application. In some embodiments, at least one of the functions of the system 700 is implemented as a software application that is a portion of an EDA tool. In some embodiments, a portion or all the functions of the system 700 are implemented as a software application that is used by the system 700. In some embodiments, a layout diagram is generated using a tool such as VIRTUOSO available from CADENCE DESIGN SYSTEMS, Inc., or another suitable layout generating tool.

In some embodiments, the routing, layouts, and other processes are realized as functions of a program stored in a non-transitory computer readable recording medium. Examples of a non-transitory computer readable recording medium include, but are not limited to, external/removable and/or internal/built-in storage or memory units, e.g., one or more optical disks such as a digital video disc or a digital versatile disc (DVD), a magnetic disk such as a hard disk, a semiconductor memory such as a ROM and a RAM, and a memory card, and the like.

As noted above, embodiments of the system 700 include fabrication tools 708 for implementing the manufacturing processes of the system 700. For example, based on the final layout, photolithographic masks may be generated, which are used to fabricate the semiconductor device by the fabrication tools 708.

Figure 17:
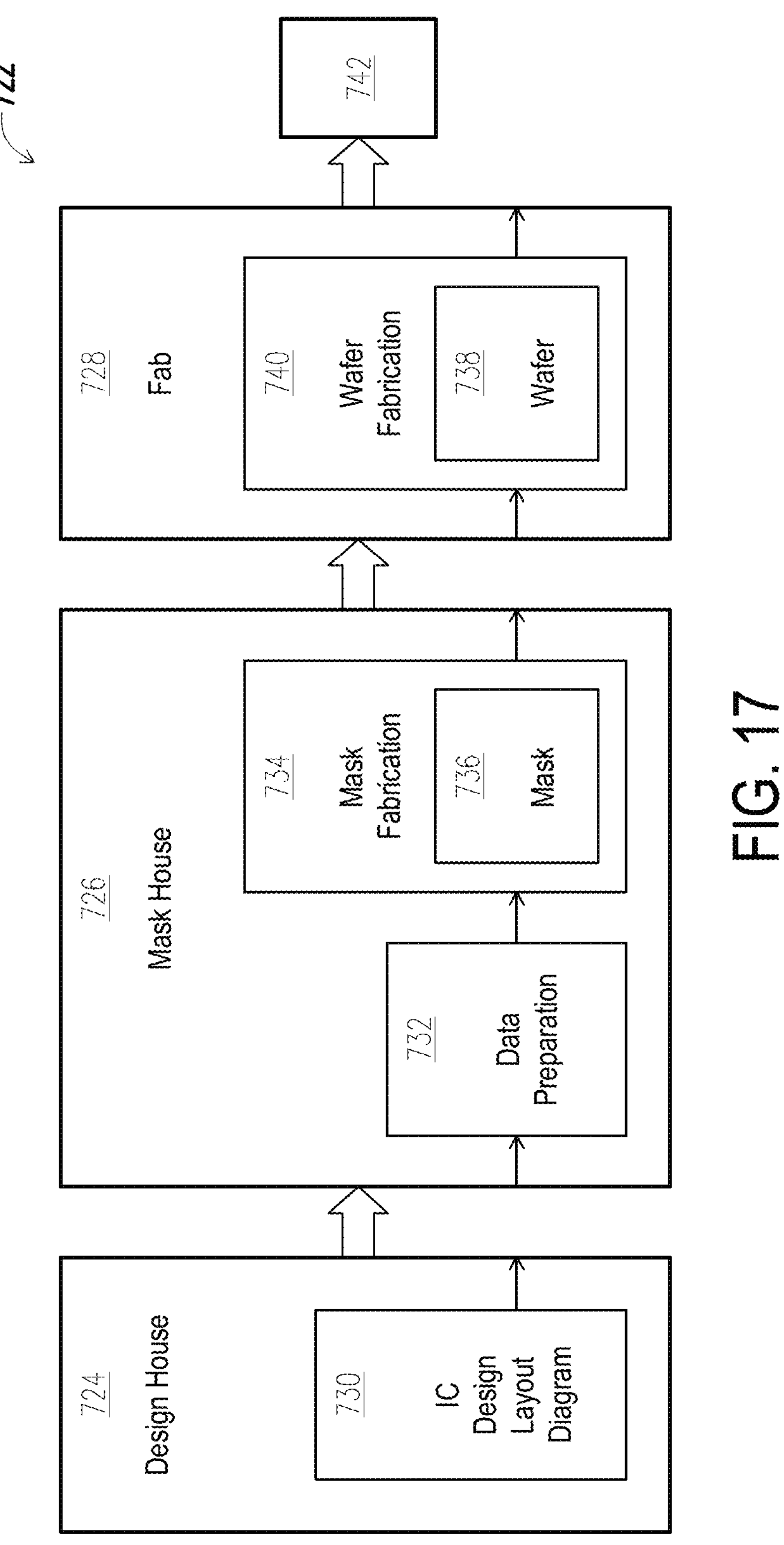
FIG. 17 is a block diagram of a semiconductor device manufacturing system and a semiconductor device manufacturing flow associated therewith, in accordance with some embodiments.

Further aspects of device fabrication are disclosed in conjunction with FIG. 17, which is a block diagram of a semiconductor device manufacturing system 722 and a semiconductor device manufacturing flow associated therewith, in accordance with some embodiments. In some embodiments, based on a layout diagram, one or more semiconductor masks and/or at least one component in a layer of a semiconductor device is fabricated using the manufacturing system 722.

In FIG. 17, the semiconductor device manufacturing system 722 includes entities, such as a design house 724, a mask house 726, and a semiconductor device manufacturer/fabricator ("Fab") 728, that interact with one another in the design, development, and manufacturing cycles and/or services related to manufacturing a semiconductor device, such as the semiconductor devices described herein. The entities in the system 722 are connected by a communications network. In some embodiments, the communications network is a single network. In some embodiments, the communications network is a variety of different networks, such as an intranet and the internet. The communications network includes wired and/or wireless communication channels. Each entity interacts with one or more of the other entities and provides services to and/or receives services from one or more of the other entities. In some embodiments, two or more of the design house 724, the mask house 726, and the semiconductor device fab 728 are owned by a single larger company. In some embodiments, two or more of the design house 724, the mask house 726, and the semiconductor device fab 728 coexist in a common facility and use common resources.

The design house (or design team) 724 generates a semiconductor device design layout diagram 730. The semiconductor device design layout diagram 730 includes various geometrical patterns, or semiconductor device layout diagrams designed for a semiconductor device. The geometrical patterns correspond to patterns of metal, oxide, or semiconductor layers that make up the various components of the semiconductor structures to be fabricated. The various layers combine to form various semiconductor device features. For example, a portion of the semiconductor device design layout diagram 730 includes various semiconductor device features, such as diagonal vias, active areas or regions, gate electrodes, sources, drains, metal lines, local vias, and openings for bond pads, to be formed in a semiconductor substrate (such as a silicon wafer) and in various material layers disposed on the semiconductor substrate. The design house 724 implements a design procedure to form a semiconductor device design layout diagram 730. The semiconductor device design layout diagram 730 is presented in one or more data files having information of the geometrical patterns. For example, semiconductor device design layout diagram 730 can be expressed in a GDSII file format or DFII file format. In some embodiments, the design procedure includes one or more of analog circuit design, digital circuit design, logic circuit design, standard cell circuit design, power distribution network (PDN) design including power via design, supply voltage track design, reference voltage track design, place and route routines, and physical layout designs.

The mask house 726 includes data preparation 732 and mask fabrication 734. The mask house 726 uses the semiconductor device design layout diagram 730 to manufacture one or more masks 736 to be used for fabricating the various layers of the semiconductor device or semiconductor structure. The mask house 726 performs mask data preparation 732, where the semiconductor device design layout diagram 730 is translated into a representative data file (RDF). The mask data preparation 732 provides the RDF to the mask fabrication 734. The mask fabrication 734 includes a mask writer that converts the RDF to an image on a substrate, such as a mask (reticle) 736 or a semiconductor wafer 738. The design layout diagram 730 is manipulated by the mask data preparation 732 to comply with characteristics of the mask writer and/or criteria of the semiconductor device fab 728. In FIG. 17, the mask data preparation 732 and the mask fabrication 734 are illustrated as separate elements. In some embodiments, the mask data preparation 732 and the mask fabrication 734 can be collectively referred to as mask data preparation.

In some embodiments, the mask data preparation 732 includes an optical proximity correction (OPC) which uses lithography enhancement techniques to compensate for image errors, such as those that can arise from diffraction, interference, other process effects and the like. The OPC adjusts the semiconductor device design layout diagram 730. In some embodiments, the mask data preparation 732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 732 includes a mask rule checker (MRC) that checks the semiconductor device design layout diagram 730 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the semiconductor device design layout diagram 730 to compensate for limitations during the mask fabrication 734, which may undo part of the modifications performed by OPC to meet mask creation rules.

In some embodiments, the mask data preparation 732 includes lithography process checking (LPC) that simulates processing that will be implemented by the semiconductor device fab 728. LPC simulates this processing based on the semiconductor device design layout diagram 730 to create a simulated manufactured device. The processing parameters in LPC simulation can include parameters associated with various processes of the semiconductor device manufacturing cycle, parameters associated with tools used for manufacturing the semiconductor device, and/or other aspects of the manufacturing process. LPC considers various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are to be repeated to further refine the semiconductor device design layout diagram 730.

The above description of mask data preparation 732 has been simplified for the purposes of clarity. In some embodiments, data preparation 732 includes additional features such as a logic operation (LOP) to modify the semiconductor device design layout diagram 730 according to manufacturing rules. Additionally, the processes applied to the semiconductor device design layout diagram 730 during data preparation 732 may be executed in a variety of different orders.

After the mask data preparation 732 and during the mask fabrication 734, a mask 736 or a group of masks 736 are fabricated based on the modified semiconductor device design layout diagram 730. In some embodiments, the mask fabrication 734 includes performing one or more lithographic exposures based on the semiconductor device design layout diagram 730. In some embodiments, an electron-beam (e-beam) or a mechanism of multiple e-beams is used to form a pattern on a mask (photomask or reticle) 736 based on the modified semiconductor device design layout diagram 730. The mask 736 can be formed in various technologies. In some embodiments, the mask 736 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region, and transmits through the transparent regions. In one example, a binary mask version of the mask 736 includes a transparent substrate (e.g., fused quartz) and an opaque material (e.g., chromium) coated in the opaque regions of the binary mask. In another example, the mask 736 is formed using a phase shift technology. In a phase shift mask (PSM) version of the mask 736, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 734 is used in a variety of processes. For example, such a mask(s) is used in an ion implantation process to form various doped regions in the semiconductor wafer 738, in an etching process to form various etching regions in the semiconductor wafer 738, and/or in other suitable processes.

The semiconductor device fab 728 includes wafer fabrication 740. The semiconductor device fab 728 is a semiconductor device fabrication business that includes one or more manufacturing facilities for the fabrication of a variety of different semiconductor device products. In some embodiments, the semiconductor device fab 728 is a semiconductor foundry. For example, there may be a manufacturing facility for the front end of line (FEOL) fabrication of a plurality of semiconductor device products, while a second manufacturing facility may provide the BEOL fabrication for the interconnection and packaging of the semiconductor device products, and a third manufacturing facility may provide other services for the foundry business.

The semiconductor device fab 728 uses the mask(s) 736 fabricated by the mask house 726 to fabricate the semiconductor structures or semiconductor devices 742 of the current disclosure. Thus, the semiconductor device fab 728 at least indirectly uses the semiconductor device design layout diagram 730 to fabricate the semiconductor structures or semiconductor devices 742 of the current disclosure. Also, the semiconductor wafer 738 includes a silicon substrate or other proper substrate having material layers formed thereon, and the semiconductor wafer 738 further includes one or more of various doped regions, dielectric features, multilevel interconnects, and the like (formed at subsequent manufacturing steps). In some embodiments, the semiconductor wafer 738 is fabricated by the semiconductor device fab 728 using the mask(s) 736 to form the semiconductor structures or semiconductor devices 742 of the current disclosure. In some embodiments, the semiconductor device fabrication includes performing one or more lithographic exposures based at least indirectly on the semiconductor device design layout diagram 730.

Disclosed embodiments thus provide communication circuits that include one or more differential to quadrature phase generators that receive at least one clock phase, generate differential signals that include complementary signals with opposite polarities, and generate quadrature clock phase signals from the differential signals. Where, the quadrature clock phase signals include four clock phases that are 90 degrees out of phase with each other. The differential to quadrature phase generators ensure that the quadrature clock phase signals are accurately generated and synchronized with incoming signals.

Disclosed embodiments further provide a device that includes a transmission circuit and a receiver circuit. The transmission circuit includes a data transmission circuit that receives data and transmits the data and a transmission clock circuit that generates transmission clock signals, multiple clock phases, and a track signal. The transmission clock circuit includes phase interpolators and transmission differential to quadrature phase generators. The phase interpolators generate phases for each of a first clock signal and a second clock signal. The transmission differential to quadrature phase generators receive phase interpolated first clock signals and phase interpolated second clock signals, duty cycle correct the phase interpolated clock signals, generate differential signals of the phase interpolated clock signals, and quadrature error correct each of the duty cycle corrected phase interpolated first clock signals and the duty cycle corrected phase interpolated second clock signals to generate the transmission clock signals used by the data transmission circuit, and to generate the multiple clock phases and the track signal used by the receiver circuit.

The receiver circuit includes a data receiver circuit that receives the data transmitted by the data transmission circuit and generates output data and a receiver clock circuit that generates receiver clock signals based on the multiple clock phases and the track signal from the transmission circuit. The receiver clock circuit receives the multiple clock phases and the track signal and provides clock phases and track signals to a receiver differential to quadrature phase generator. The receiver differential to quadrature phase generator duty cycle corrects the clock phases and quadrature error corrects the duty cycle corrected clock phases to generate the receiver clock signals used by the data receiver circuit.

Disclosed embodiments further provide a method of operating a communications circuit that includes at least one differential to quadrature phase generator, as described in relation to FIG. 15.

Advantages of the disclosed communication circuits include low distortion, 50% duty-cycles, offset cancellation, and PVT immunity in the differential to quadrature phase generators.

In accordance with some embodiments, a device includes a transmission clock circuit that includes a phase interpolator circuit and a transmission differential to quadrature phase generator. The phase interpolator circuit interpolates phases for each of a first clock signal and a second clock signal and provides phase interpolated first clock signals and phase interpolated second clock signals. The transmission differential to quadrature phase generator, duty cycle corrects each of the phase interpolated first clock signals and the phase interpolated second clock signals to provide duty cycle corrected phase interpolated first clock signals and duty cycle corrected phase interpolated second clock signals, quadrature error corrects each of the duty cycle corrected phase interpolated first clock signals and the duty cycle corrected phase interpolated second clock signals to provide quadrature error corrected duty cycle corrected phase interpolated first clock signals and quadrature error corrected duty cycle corrected phase interpolated second clock signals, outputs transmission clock signals based on the quadrature error corrected duty cycle corrected phase interpolated first clock signals, and outputs multiple clock phases and a track signal based on the quadrature error corrected duty cycle corrected phase interpolated second clock signals.

In accordance with further embodiments, a device includes a transmission clock circuit and a receiver clock circuit. The transmission clock circuit generates transmission clock signals to transmit data and includes a phase interpolator circuit that receives a first clock signal and a second clock signal and that interpolates phases for each of the first clock signal and the second clock signal to provide phase interpolated first clock signals and phase interpolated second clock signals, and a transmission differential to quadrature phase generator that is configured to duty cycle correct each of the phase interpolated first clock signals and the phase interpolated second clock signals to provide duty cycle corrected phase interpolated first clock signals and duty cycle corrected phase interpolated second clock signals, and to quadrature error correct each of the duty cycle corrected phase interpolated first clock signals and the duty cycle corrected phase interpolated second clock signals to generate the transmission clock signals, multiple clock phases, and a track signal. The receiver clock circuit generates receiver clock signals based on the multiple clock phases and the track signal to receive the data transmitted and to generate output data. The receiver clock circuit includes a receiver differential to quadrature phase generator configured to receive track signals based on the track signal, duty cycle correct clock phase signals based on the multiple clock phases to provide duty cycle corrected clock phase signals, quadrature error correct the duty cycle corrected clock phase signals to provide quadrature error corrected duty cycle corrected clock phase signals, and to provide the receiver clock signals based on the quadrature error corrected duty cycle corrected clock phase signals.

In accordance with still further disclosed aspects, a method of operating a communications circuit includes at least one differential to quadrature phase generator. The method includes generating, by a transmission clock circuit, a first clock signal and a second clock signal based on at least one clock signal; phase interpolating, by a phase interpolator circuit, each of the first clock signal and the second clock signal to provide phase interpolated first clock signals and phase interpolated second clock signals; duty cycle correcting, by a transmission differential to quadrature phase generator, each of the phase interpolated first clock signals and the phase interpolated second clock signals to provide duty cycle corrected phase interpolated first clock signals and duty cycle corrected phase interpolated second clock signals; quadrature error correcting, by the transmission differential to quadrature phase generator, each of the duty cycle corrected phase interpolated first clock signals and the duty cycle corrected phase interpolated second clock signals to generate transmission clock signals, multiple clock phases, and a track signal; and transmitting data from a data transmission circuit based on the transmission clock signals.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
- a transmission clock circuit that includes:
  - a phase interpolator circuit that interpolates phases for each of a first clock signal and a second clock signal and provides phase interpolated first clock signals and phase interpolated second clock signals; and
  - a transmission differential to quadrature phase generator configured to:
    - duty cycle correct each of the phase interpolated first clock signals and the phase interpolated second clock signals to provide duty cycle corrected phase interpolated first clock signals and duty cycle corrected phase interpolated second clock signals;
    - quadrature error correct each of the duty cycle corrected phase interpolated first clock signals and the duty cycle corrected phase interpolated second clock signals to provide quadrature error corrected duty cycle corrected phase interpolated first clock signals and quadrature error corrected duty cycle corrected phase interpolated second clock signals;
    - output transmission clock signals based on the quadrature error corrected duty cycle corrected phase interpolated first clock signals; and
    - output multiple clock phases and a track signal based on the quadrature error corrected duty cycle corrected phase interpolated second clock signals, and
- a receiver clock circuit that receives the multiple clock phases and the track signal from the transmission clock circuit, the receiver clock circuit includes:
  - a track circuit that generates track signals from the track signal; and
  - a receiver differential to quadrature phase generator configured to receive the track signals;
    - duty cycle correct clock phase signals that are based on the multiple clock phases to provide duty cycle corrected clock phase signals;
    - quadrature error correct the duty cycle corrected clock phase signals to provide quadrature error corrected duty cycle corrected clock phase signals; and
    - provide receiver clock signals based on the quadrature error corrected duty cycle corrected clock phase signals.

2. The device of claim 1, comprising a data transmission circuit that receives data and transmits the data, wherein the transmission clock circuit includes:
- at least one first buffer that provides the transmission clock signals to the data transmission circuit; and
- at least one second buffer that provides the multiple clock phases and the track signal to the receiver clock circuit.

3. The device of claim 2, comprising a data receiver circuit that receives the data transmitted by the data transmission circuit, the receiver clock circuit includes:
- a first receiver buffer circuit that receives the multiple clock phases and the track signal from the transmission clock circuit;
- a phase generator that receives the multiple clock phases from the first receiver buffer circuit and provides the clock phase signals to the receiver differential to quadrature phase generator; and
- a second receiver buffer circuit that provides the receiver clock signals to the data receiver circuit.

4. The device of claim 2, comprising a data receiver circuit that receives the data transmitted by the data transmission circuit, wherein the receiver clock circuit includes:
- a first receiver buffer circuit that receives the multiple clock phases and the track signal from the transmission clock circuit and provides the multiple clock phases to the receiver differential to quadrature phase generator; and
- a second receiver buffer circuit that provides the receiver clock signals to the data receiver circuit.

5. The device of claim 1, wherein the receiver differential to quadrature phase generator includes:
- at least one duty cycle corrector that corrects duty cycles of the clock phase signals to provide the duty cycle corrected clock phase signals; and
- at least one quadrature error corrector that corrects quadrature phases of the duty cycle corrected clock phase signals to provide the quadrature error corrected duty cycle corrected clock phase signals.

6. The device of claim 1, wherein the transmission differential to quadrature phase generator includes:
- at least one duty cycle corrector that corrects duty cycles of each of the phase interpolated first clock signals and the phase interpolated second clock signals to provide the duty cycle corrected phase interpolated first clock signals and the duty cycle corrected phase interpolated second clock signals; and
- at least one quadrature error corrector that quadrature error corrects each of the duty cycle corrected phase interpolated first clock signals and the duty cycle corrected phase interpolated second clock signals to provide the quadrature error corrected duty cycle corrected phase interpolated first clock signals and the quadrature error corrected duty cycle corrected phase interpolated second clock signals.

7. The device of claim 6, wherein the at least one duty cycle corrector includes an analog duty cycle corrector.

8. The device of claim 6, wherein the at least one quadrature error corrector includes an analog quadrature error corrector.

9. The device of claim 6, wherein the at least one quadrature error corrector includes a digital quadrature error corrector.

10. A device, comprising:

a transmission clock circuit that generates transmission clock signals to transmit data, the transmission clock circuit includes:

a phase interpolator circuit that receives a first clock signal and a second clock signal and that interpolates phases for each of the first clock signal and the second clock signal to provide phase interpolated first clock signals and phase interpolated second clock signals; and a transmission differential to quadrature phase generator configured to:

duty cycle correct each of the phase interpolated first clock signals and the phase interpolated second clock signals to provide duty cycle corrected phase interpolated first clock signals and duty cycle corrected phase interpolated second clock signals; and quadrature error correct each of the duty cycle corrected phase interpolated first clock signals and the duty cycle corrected phase interpolated second clock signals to generate the transmission clock signals, multiple clock phases, and a track signal; and a receiver clock circuit that generates receiver clock signals based on the multiple clock phases and the track signal to receive the data transmitted and to generate output data, the receiver clock circuit includes:

a receiver differential to quadrature phase generator configured to:

receive track signals based on the track signal;

duty cycle correct clock phase signals based on the multiple clock phases to provide duty cycle corrected clock phase signals;

quadrature error correct the duty cycle corrected clock phase signals to provide quadrature error corrected duty cycle corrected clock phase signals; and provide the receiver clock signals based on the quadrature error corrected duty cycle corrected clock phase signals.

11. The device of claim 10, wherein the transmission differential to quadrature phase generator includes:

at least one transmission duty cycle corrector that duty cycle corrects each of the phase interpolated first clock signals and the phase interpolated second clock signals to provide the duty cycle corrected phase interpolated first clock signals and the duty cycle corrected phase interpolated second clock signals; and at least one transmission quadrature error corrector that quadrature error corrects each of the duty cycle corrected phase interpolated first clock signals and the duty cycle corrected phase interpolated second clock signals to generate the transmission clock signals, the multiple clock phases, and the track signal.

12. The device of claim 10, wherein the receiver differential to quadrature phase generator includes:

at least one receiver duty cycle corrector that duty cycle corrects the clock phase signals to provide the duty cycle corrected clock phase signals; and at least one receiver quadrature error corrector that quadrature error corrects the duty cycle corrected clock phase signals to provide the quadrature error corrected duty cycle corrected clock phase signals.

13. The device of claim 12, wherein the at least one receiver duty cycle corrector includes a digital duty cycle corrector.

14. The device of claim 12, wherein the at least one receiver quadrature error corrector includes an analog quadrature error corrector.

15. The device of claim 12, wherein the at least one receiver quadrature error corrector includes a digital quadrature error corrector.

16. A method of operating a communications circuit that includes at least one differential to quadrature phase generator, the method includes:

generating, by a transmission clock circuit, a first clock signal and a second clock signal based on at least one clock signal;

phase interpolating, by a phase interpolator circuit, each of the first clock signal and the second clock signal to provide phase interpolated first clock signals and phase interpolated second clock signals;

duty cycle correcting, by a transmission differential to quadrature phase generator, each of the phase interpolated first clock signals and the phase interpolated second clock signals to provide duty cycle corrected phase interpolated first clock signals and duty cycle corrected phase interpolated second clock signals;

quadrature error correcting, by the transmission differential to quadrature phase generator, each of the duty cycle corrected phase interpolated first clock signals and the duty cycle corrected phase interpolated second clock signals to generate transmission clock signals, multiple clock phases, and a track signal;

transmitting data from a data transmission circuit based on the transmission clock signals;

receiving by a receiver clock circuit, the multiple clock phases and the track signal;

providing clock phase signals based on the multiple clock phases;

generating, by a track circuit, track signals based on the track signal;

duty cycle correcting, by a receiver differential to quadrature phase generator, the clock phase signals to provide duty cycle corrected clock phase signals;

quadrature error correcting by the receiver differential to quadrature phase generator, the duty cycle corrected clock phase signals to generate receiver clock signals; and receiving the data transmitted from the data transmission circuit and outputting the data based on the receiver clock signals.

17. The method of claim 6, wherein duty cycle correcting, by the receiver differential to quadrature phase generator, includes duty cycle correcting by a duty cycle corrector, and quadrature error correcting, by the receiver differential to quadrature phase generator, includes quadrature error correcting by a quadrature error corrector.

18. The method of claim 16, wherein duty cycle correcting, by the transmission differential to quadrature phase generator, includes duty cycle correcting by a duty cycle corrector, and quadrature error correcting, by the transmission differential to quadrature phase generator, includes quadrature error correcting by a quadrature error corrector.

19. The device of claim 11, wherein the at least one transmission quadrature error corrector includes an analog quadrature error corrector.

20. The device of claim 11, wherein the at least one transmission quadrature error corrector includes a digital quadrature error corrector.

* * * * *